(12) United States Patent
Yaoi et al.

(10) Patent No.: US 7,405,974 B2
(45) Date of Patent: Jul. 29, 2008

(54) SEMICONDUCTOR MEMORY DEVICE, PAGE BUFFER RESOURCE ASSIGNING METHOD AND CIRCUIT THEREFOR, COMPUTER SYSTEM AND MOBILE ELECTRONIC DEVICE

(75) Inventors: Yoshifumi Yaoi, Yamatokoriyama (JP); Yasuaki Iwase, Tenri (JP); Hiroshi Iwata, Nara (JP); Akihide Shibata, Nara (JP); Yoshinao Morikawa, Ikoma (JP); Masaru Nawaki, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 477 days.

(21) Appl. No.: 10/848,324

(22) Filed: May 19, 2004

(65) Prior Publication Data
US 2004/0268027 A1    Dec. 30, 2004

(30) Foreign Application Priority Data
May 20, 2003    (JP)    ............................. 2003-142750

(51) Int. Cl.
*G11C 16/00* (2006.01)
(52) U.S. Cl. ........................... 365/185.12; 365/185.05; 365/189.17; 257/324
(58) Field of Classification Search ............. 365/185.05
See application file for complete search history.

(56) References Cited

U.S. PATENT DOCUMENTS

| | | | |
|---|---|---|---|
| 5,353,256 A * | 10/1994 | Fandrich et al. ........ | 365/185.11 |
| 5,369,754 A * | 11/1994 | Fandrich et al. .............. | 711/103 |
| 5,424,979 A | 6/1995 | Morii | |
| 5,509,134 A * | 4/1996 | Fandrich et al. .............. | 711/103 |
| 5,519,847 A * | 5/1996 | Fandrich et al. .............. | 711/169 |
| 5,623,620 A * | 4/1997 | Fandrich et al. .............. | 711/202 |
| 5,692,138 A * | 11/1997 | Fandrich et al. .............. | 710/305 |
| 5,802,552 A | 9/1998 | Fandrich et al. | |
| 5,835,927 A * | 11/1998 | Fandrich et al. ................. | 711/2 |
| 5,838,041 A | 11/1998 | Sakagami et al. | |
| 5,929,480 A | 7/1999 | Hisamune | |
| 7,050,337 B2 * | 5/2006 | Iwase et al. ............ | 365/189.05 |
| 2003/0164517 A1 | 9/2003 | Kamei et al. | |

(Continued)

FOREIGN PATENT DOCUMENTS

JP    5-81072 B2    11/1993

(Continued)

*Primary Examiner*—Tan T. Nguyen
(74) *Attorney, Agent, or Firm*—Birch, Stewart, Kolasch & Birch, LLP

(57) ABSTRACT

A semiconductor memory device includes a page buffer circuit and an arrangement of memory elements each including: a gate electrode provided on a semiconductor layer with an intervening gate insulating film; a channel region provided beneath the gate electrode; a diffusion area provided on both sides of the channel region, having an opposite polarity to the channel region; and a memory functioning member provided on both sides of the gate electrodes, having a function of storing electric charge. The page buffer circuit provides a common resource shared between a memory array controller and a user. The page buffer circuit has two planes containing random access memory arrays. The page buffer circuit also includes a mode control section to facilitate access to the planes over a main bus in user mode and access to the planes by the memory array controller in memory control mode.

64 Claims, 22 Drawing Sheets

U.S. PATENT DOCUMENTS

2004/0160828 A1 * 8/2004 Iwata et al. ............ 365/185.28

FOREIGN PATENT DOCUMENTS

| | | |
|---|---|---|
| JP | 5-304277 A | 11/1993 |
| JP | 9-97849 A | 4/1997 |
| JP | 9-116119 A | 5/1997 |
| JP | 2001-156188 A | 6/2001 |
| JP | 2001-230332 A | 8/2001 |
| WO | WO 99/07000 A2 | 2/1999 |
| WO | WO 01/17030 A1 | 3/2001 |
| WO | WO 03/044868 A1 | 5/2003 |
| WO | WO 03/075358 A1 | 9/2003 |
| WO | WO 03/075359 A1 | 9/2003 |
| WO | WO 03/103058 A1 | 12/2003 |
| WO | WO 2004/034474 A1 | 4/2004 |

* cited by examiner

SEMICONDUCTOR MEMORY DEVICE, PAGE BUFFER RESOURCE ASSIGNING METHOD AND CIRCUIT THEREFOR, COMPUTER SYSTEM AND MOBILE ELECTRONIC DEVICE This Nonprovisional application claims priority under 35 U.S.C. § 119(a) on Patent Application No. 2003-142750 filed in Japan on May 20, 2003, the entire contents of which are hereby incorporated by reference.

FIELD OF THE INVENTION

The invention relates to integrated semiconductor memory devices and in particular to page buffer resource assignment for semiconductor memory devices.

BACKGROUND OF THE INVENTION

Conventionally, a flash memory has been used as a non-volatile memory.

In this flash memory, as shown in FIG. 30, a memory cell is constituted such that a semiconductor substrate 901 includes thereon, via a gate insulating film, a floating gate 902, an insulating film 907, and a word line (control gate) 903 in this order, and a source line 904 and a bit line 905 are formed on both sides of the floating gate 902. Around the memory cell, an element separation region 906 is formed (for example, Japanese Laid-Open Patent Application No. 304277/1993 (Tokukaihei 5-304277; published on Nov. 16, 1993).

The memory cell holds memory depending upon the amount of charges in the floating gate 902. A memory cell array which is an array of memory cells enables rewriting and read-out operations with respect to intended memory cells by applying a predetermined voltage to particularly selected word lines and bit lines.

Such a flash memory shows drain current (Id) to gate voltage (Vg) characteristics as shown in FIG. 31 with variation in the amount of charges in the floating gate. Increase in the amount of negative charges in the floating gate increases a threshold value, and an Id-Vg curve moves substantially parallel to the direction where Vg increases.

However, such a flash memory has the following problems: it is functionally necessary that the insulating film 907 is placed to isolate the floating gate 902 from the word line 903; and it is difficult to reduce the thickness of the gate insulating film to prevent leakage of charges from the floating gate 902. Therefore, it is difficult to realize the reduction in thickness of the insulating film 907 and the gate insulating film, interfering with the realization of a finer memory cell.

SUMMARY OF THE INVENTION

The present invention has an objective to provide a semiconductor memory device and a mobile electronic device which are readily scaled down in size.

A semiconductor memory device in accordance with the present invention, to achieve the objective, includes:

a memory array of switching memories, i.e. memory elements each including: a gate electrode provided on a semiconductor layer with an intervening gate insulating film; a channel region provided beneath the gate electrode; a diffusion area provided on both sides of the channel region, having an opposite polarity to the channel region; and a memory functioning member provided on both sides of the gate electrodes, having a function of storing electric charge;

a memory control circuit for programming the memory array;

a page buffer circuit providing a common resource shared between the memory control circuit and a user; and an interface circuit processing commands over a main bus.

The page buffer circuit includes a set of page planes. Here, the page planes include respective RAM arrays. The page buffer circuit also controls mode to enable access to the page planes over the main bus in user mode and access to the page planes by the memory control circuit in memory control mode. The mode, either user mode or memory control mode, is determined by control signals for the respective page planes.

According to a command request from the user, the interface circuit generates the control signals by which the page planes are assigned to the user mode and the memory control mode.

In such an arrangement, by sharing the page buffer resource between the user and the memory array controller in the semiconductor memory device, programming throughput for the semiconductor memory device is improved. In addition, a multipage plane page buffer for the semiconductor memory device is provided. Here, the page planes function either in user mode or memory control mode. Further, when a page plane is in user mode, the user can readily access the page plane; when a page plane is in memory control mode, the memory control circuit can readily access the page plane.

By the interface circuit swapping the user mode and the memory control mode between the first page plane and the second page plane, the interface circuit harmonizes the assignment of the user mode and the memory control mode between the page planes; the memory array can be programmed with data from one of the page planes, while the memory control circuit is reading/rewriting data from/to the other page plane.

Additional advantages and novel features of the invention will be set forth in part in the description which follows, and in part will become apparent to those skilled in the art upon examination of the following or may be learned by practice of the invention.

DESCRIPTION OF THE EMBODIMENTS

Figure 1:
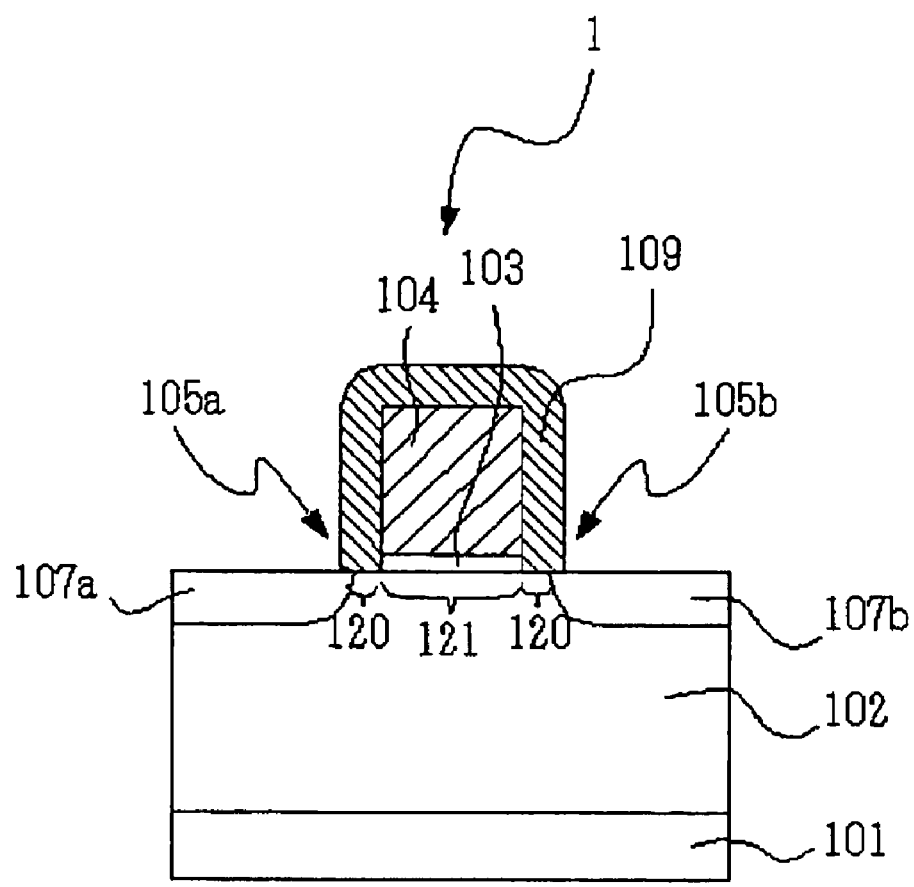
FIG. 1 is a schematic cross-sectional view showing a major part of a memory element in a semiconductor memory device in accordance with embodiment 1 of the present invention.
Figure 2:
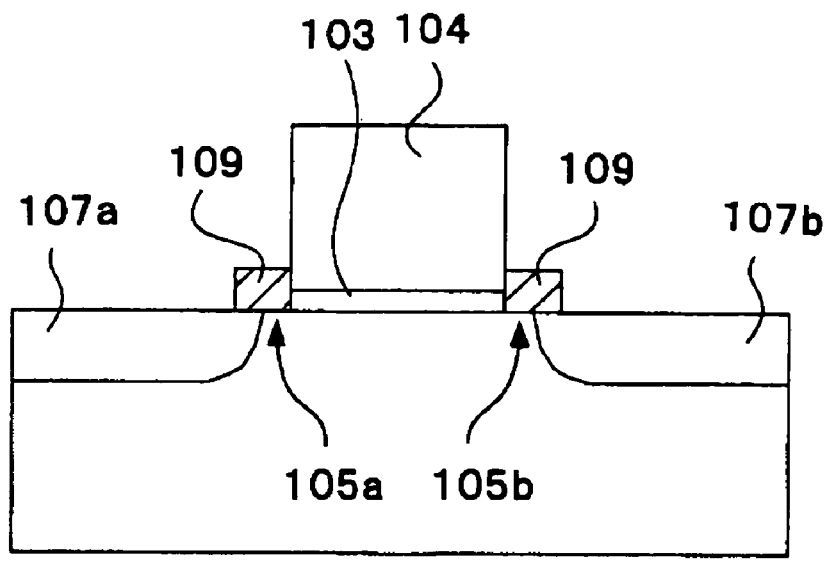
FIGS. 2(a), 2(b) are schematic cross-sectional views showing a major part of a variation of the memory element in the semiconductor memory device in accordance with embodiment 1 of the present invention.
Figure 2:
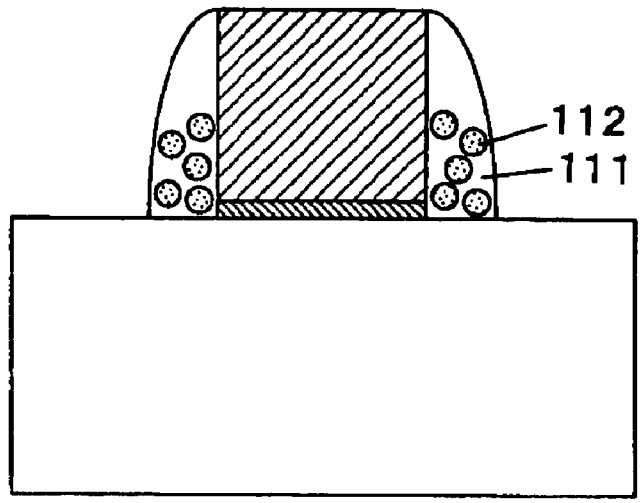

The following will describe embodiments of the present invention with reference to FIG. 1 through FIG. 27.

A semiconductor storage device of the present invention mainly consists of a memory element and a control circuit for storing data in the memory element.

The memory element mainly consists of a semiconductor layer, a gate insulating film, a gate electrode, a channel region, a diffusion region, and a memory functioning member. Here, the channel region, which is a conducting region of the same type as the semiconductor layer, means a region beneath the gate electrode. The diffusion region means a conducting region of the other type than the channel region.

Specifically, the memory element (device) of the present invention may be provided with a first conductive region (which acts as a diffusion region), a second conductive region (which acts as a channel region), a memory functioning member, a gate insulating film, and an electrode. The first conductive region is of a first conductivity type (either n- or p-type), and the second conductive region is of a second conductivity type, that is, of the other type (where the first conductive region is n-type, the second conductive region is p-type, and vice versa). The memory functioning member is provided over a boundary between the first and second conductive regions. The gate insulating film is provided between the memory functioning member and the electrode. However, it is appropriate that the memory element is so arranged as to include (i) a gate electrode provided on a gate insulating film, (ii) two memory functioning members provided on both sides of the gate electrode, (iii) and two diffusion regions provided such that the memory functioning members are respectively sandwiched between each diffusion region and the gate electrode, and (iv) a channel region provided under the gate electrode.

A semiconductor device of the present embodiment is preferably arranged such that the device is formed on a well region of the first conductivity type, the well region being formed on a semiconductor substrate or preferably in the semiconductor substrate, and acting as a semiconductor layer. The semiconductor substrate is not particularly limited, provided that the semiconductor substrate is applicable for a semiconductor device. For example, a bulk substrate made from an element semiconductor or a compound semiconductor may be used. Examples of the element semiconductor are silicon, germanium, and the like. Examples of the compound semiconductor are silicon germanium, GaAs, InGaAs, ZnSe, GaN, and the like. Moreover, the semiconductor substrate may be a substrate whose top layer is a semiconductor layer. Examples of this type of the substrate are: various substrates such as SOI (Silicon on Insulator) substrates, SOS substrate, multi-layer SOI substrate; and a substrate having a semiconductor layer on a substrate made of glass or plastic. Of those substrates, the silicon substrate, the SOI substrate (whose top layer is a silicon layer) and the like are preferable. The semiconductor substrate and the semiconductor layer may be monocrystal (for example, produced by epitaxial growth), polycrystal, or amorphous, even though an amount of current flowing therethrough varies depending on whether they are monocrystal, polycrystal, or amorphous.

It is preferable that an element separating region is provided on the semiconductor layer. By further including, in combination, an element (such as a transistor, a capacitor, and/or a resistor), a circuit formed by using the elements, a semiconductor device, and/or an interlayer-insulating film, the semiconductor layer may have a single-layer structure or a multi-layer structure. Note that the element separating region may be formed from an element separating film such as an LOCOS film, a trench oxide film, an SI film, and the like. The semiconductor layer may be either p-type conductive or n-type conductive. It is preferable that the semiconductor layer is provided with at least one well region of the first conductivity type (p-type or n-type). As the semiconductor layer and the well region, it is possible to use a semiconductor layer and the well region whose impurity concentration is within a range generally used in a field in which the semiconductor device is to be used. In case where the SOI substrate is used to provide the semiconductor layer, the semiconductor layer, which is a top layer and may be provided with a well region, may be provided with a body region under a channel region.

The gate insulating film is not particularly limited, provided that the gate insulating film is a gate insulating film generally used in a semiconductor device. For example, the gate insulating film may be an insulating film such as a silicon oxide film, a silicon nitride film, or the like; a single-layered high dielectric film or a laminate film including the high dielectric film (the high dielectric film may be an aluminum oxide film, titanium oxide film, a tantalum oxide film, a hafnium oxide film, or the like). Of those films, the silicon oxide film is preferable. The gate insulating film may have a thickness of, for example, about 1 nm to 20 nm, preferably of 1 nm to 6 nm. The gate insulating film may be provided only right under the gate electrode, or may have a size larger (a width wider) than the gate electrode.

The gate electrode is provided on the gate insulating film, and has a shape that is usually used in a semiconductor device, or a shape having a recess section in its bottom end portion. It is preferable that the gate electrode has an integrated shape without being separated by using a single-layered or a multi-layered conductive film. However, the gate electrode may be so arranged as to have a shape that is separated by using a single-layered or a multi-layered conductive film. Moreover, the gate electrode may be provided with a side-wall insulating film on its side. The gate electrode is not particularly limited, provided that the gate electrode is a gate electrode generally used in a semiconductor device. The gate electrode may be formed from a conductive film, which may be a single-layered or laminate film prepared from: polysilicon; a metal such as copper, aluminum, or the like; a metal having a high melting point, such as tungsten, titan, tantalum or the like; a silicide of the metal having the melting point; or the like. It is appropriate that the gate electrode has a thickness in a range of from 50 nm to 400 nm approximately, for example. Note that the channel region is formed under the gate electrode.

It is preferable that the gate electrode is provided only on a side wall of a memory functioning member later described, or is so provided as not to cover a top part of the memory functioning member. Those arrangements allow to provide a contact plug in a vicinity of the gate electrode. Therefore, this arrangement makes it easier to attain finer memory element. Moreover, the memory element having the simple arrangement as described above can be easily produced, thereby attaining a better yield.

The memory functioning member at least has a function to hold electric charges (hereinafter, this function is referred to as charge-holding function). In other words, the memory functioning member is configured (i) to accumulate and hold electric charges (charges), (ii) to trap electric charges, or (iii) to stay under an electric charge-polarized condition. The charge-holding function is attained in the memory functioning member, by providing the memory functioning member with a film or a region, which has a function to hold electric charges. Examples of materials to give the charge-holding function are: silicon nitride; silicon; silicate glass containing impurity such as phosphorus, boron, and/or the like; silicon carbide; alumina; high dielectric materials such as hafnium oxide, zirconium oxide, tantalum oxide, and the like; zinc oxide; ferroelectric substances; metals; and the like. Therefore, the memory functioning member may have a single-layered or laminated structure formed from, for example, (i) an insulating film including the silicon nitride film, (ii) an insulating film including a conductive layer or a semiconductor layer; an insulating layer including at least one dot made of a conductive material or a semiconductor material; an insulating film including a ferroelectric film in which polarization of electric charge is caused by applying an electric field and then is maintained; and the like film. Of those films, the silicon nitride film is preferable. The reasons why the silicon nitride film is preferable are as follows: a large hysteresis property can be attained because the silicon nitride film has a large number of levels for trapping electric charges; a good holding property can be attained by the silicon nitride film because the silicon nitride film holds the electric charge for a long time thereby preventing leak path, which causes electric charge leakage; and the silicon nitride film is a raw material used as standard in the LSI process.

With the arrangement in which the memory functioning member is provided with the film (such as the silicon nitride film or the like) having the charge-holding function, it is possible to attain more reliable memory holding function. Because the silicon nitride film is an insulator, electric charge leakage in part of the silicon nitride film will not lead to immediate loss of electric charge from the whole silicon nitride film. Moreover, in case where a plurality of memory elements are arrayed, this arrangement prevents erasure of data stored in a memory functioning member that touches an adjacent memory functioning member when the memory elements get closer to each other, on contrary to an arrangement in which the memory functioning members are conductive. Further, this arrangement allows to provide the contact plug in a greater vicinity of the memory functioning member. In some cases, this arrangement allows the contract plug to be so provided as to overlap the memory functioning member. Thus, this arrangement makes it easier to attain a finer memory element.

Note that the film having the charge-holding function is not necessarily in a film-like shape. Even if the film having the charge-holding function is not in the film-like shape, the more reliable memory holding can be attained. It is preferable that pieces of the film having the charge-holding function are dispersed (scattered) inside the insulating film. Specifically, it is preferable that the pieces of the film having the charge-holding function are scattered in a material in which electric charges are hardly held, for example, in silicon oxide, in such a manner that the pieces are scattered in the material as if dots scattered in the material.

In case where a conductive film or a semiconductor layer is used as the film having the charge-holding function (charge holding film), it is preferable that the charge holding film is so provided that (i) the charge holding film and (ii) the semiconductor layer (semiconductor substrate, well region, body region, source region, drain region, or diffusion region) or the gate electrode are separated by the insulating film provided therebetween, so that the charge holding film will not directly touch the semiconductor layer or the gate electrode. For example, this arrangement can be attained by (i) a laminate structure in which the conductive film is provided on the insulating film, (ii) a structure in which pieces of the conductive film are scatted, as if dots scattered therein, in the insulating film, (iii) a structure in which a conductive film is provided in part of side-wall insulating film formed on a side wall of a gate, or (iv) the like structure.

The arrangement is preferable in which the insulating film including the conductive film or the semiconductor film is used as the memory functioning member, because this arrangement makes it possible to freely control an amount of electric charges entering a conductor or a semiconductor in the memory functioning member, thereby making it easier to attain multi-valued property. Furthermore, the arrangement is preferable in which the insulating film including at least one dot made of a conductive material or a semiconductor material is used as the memory functioning member, because this arrangement makes it easier to write and erase by direct tunneling of charges, thereby attaining lower power consumption.

Moreover, the memory functioning member may be a ferroelectric film whose polarization direction is changeable according to electric field. The ferroelectric film may be PZT (Lead Zirco-Titanate) family ferroelectric film, PLZT (Lead Zirco-Titanate) family ferroelectric film, or the like film. In this arrangement, polarization causes generation of charges substantially on a surface of the ferroelectric film. The charges thus generated are held. Therefore, it is possible to attain the hysteresis property that is similar to the hysteresis property attained by a film having a function to trap charges supplied from an outside of a film having a memory function. Furthermore, in order to hold the charges therein, the ferroelectric film needs no external supply of the charges in this arrangement. The ferroelectric film can attain the hysteresis property simply by polarization of the charges inside the film. Thus, fast writing (programming) and erasing can be realized by this arrangement. Therefore, this arrangement is preferable.

Note that it is appropriate to arrange such that the insulating film included in the memory functioning member is a region from which the charges hardly leak out, or a film having a function of making it difficult for the charges to leak out. For example, a silicon oxide film or the like has the function of making it difficult for the charges to leak out.

The charge holding film to be included in the memory functioning member is provided directly on each side of the gate electrode. Alternatively, the charge holding film is provided indirectly on each side of the gate electrode with the insulating film sandwiched between the charge holding film and the gate electrode. Further, the charge holding film is provided on the gate insulating film (semiconductor substrate, well region, body region, source region, drain region or diffusion region) indirectly or directly, that is, with or without a gate insulating film sandwiched therebetween. It is preferable that the side walls of the gate electrode are partially or wholly covered with (i) the charge holding films provided directly thereon or (ii) the charge holding films provided indirectly thereon with the insulating film sandwiched between the charge holding film and the side wall of the gate electrode. As a specific example of usage, if the gate electrode has a recess section in its bottom end portion, the charge holding film may be formed such that the recess section is partially or completely filled with (i) the charge holding film provided directly on the gate electrode or (ii) the charge holding film provided indirectly on the gate electrode with the insulating film sandwiched between the charge holding film and the gate electrode.

The diffusion region may function as the source region and drain region, and has opposite conductivity to that of the semiconductor layer or the well region. It is preferable that impurity concentration changes steeply over the junction between the diffusion region and the conductive layer or the well region. This arrangement makes it possible to attain efficient generation of hot electrons or hot holes by using a low voltage, thereby attaining a high-speed operation by using a lower electrode. The diffusion region is not particularly limited in terms of depth of its junction. Thus, the depth of the junction of the diffusion region may be arbitrarily adjusted depending on properties and the like of the semiconductor storage device to be obtained. In case where the semiconductor substrate is an SOI substrate, the depth of the junction of the diffusion region may be shallower than a thickness of the top-layer semiconductor layer. However, it is preferable that the depth of the junction is approximately equivalent to the thickness of the top-layer semiconductor layer.

The diffusion regions may be so provided as to (i) overlap an end of a gate electrode, (ii) be located on the end of the gate electrode but not beyond the end of the gate electrode, or (iii) be offset with respect to the gate electrode terminal. Especially in case where the diffusion region is offset with respect to the gate electrode terminal, an offset region under the charge holding film is reversed when a voltage is applied on the gate electrode. An amount of the charges accumulated in the memory functioning member largely changes how easily the offset region is reversed. Thus, in case where the diffusion region is offset with respect to the gate electrode terminal, a higher memory effect and reduction in short-channel effect are attained. Therefore, it is preferable that the diffusion region is offset with respect to the gate electrode terminal. However, if the diffusion region is offset too much, a driving current across the diffusion region (between source and drain) becomes small significantly. Therefore, it is preferable that an offset amount (a distance in a gate length direction between one gate electrode terminal and the diffusion region that is closer to the gate electrode terminal) is shorter than a thickness of the charge holding film, the thickness being parallel to the gate length direction. It is especially important that at least part of the charge holding film (a film having the charge holding function) in the memory functioning member overlaps part of the diffusion region. This is important because the memory element constituting the semiconductor storage device performs its data rewriting operation by using an electric field across the memory functioning member, the electric field generated by an voltage difference between the gate electrode and the diffusion region, the voltage difference existing only on the side wall of the memory functioning member.

The diffusion region may be so arranged that part of the diffusion region is located on a surface of the channel region, that is, in a position higher than a lower surface of the gate insulating film. In this arrangement, it is appropriate that a conductive film integrated with the diffusion region is provided on the diffusion region formed in the semiconductor substrate. The conductive film is, for example, made of (i) a semiconductor such as polysilicon, amorphous silicon, or the like, (ii) a silicide, (iii) any one of the above-mentioned metals and the metals having a high melting point, or (iv) the like. Of those materials, polysilicon is most preferable. Polysilicon has an impurity diffusion rate much greater than that of the semiconductor layer. Because of this, the use of polysilicon makes it easier to attain the diffusion region whose junction has a shallower depth in the semiconductor layer. This makes it easier to suppress the short channel effect. Note that, in this arrangement, at least part of the memory functioning member is sandwiched between the gate electrode and the part of the diffusion region.

The memory element of the present embodiment may be formed via a semiconductor process generally used, for example by a method similar to a method of forming a single-layered or laminated structured side wall spacer on the side wall of the gate electrode. Specifically, the memory element may be formed by the following methods: (1) after forming the gate electrode, formed is a single-layered film or a laminate film including the film (hereinafter "charge holding film") having the function of holding the charge (the single-layered film or a laminate film may be a single layer of the charge holding film, a laminate film structured as the charge holding film/the insulating film, a laminate film structured as the insulating film/charge holding film, a laminate film structured as the insulating film/charge holding film/insulating film, and the like film). And then, the film is etched backed under an appropriate condition so that the film retains a side-wall-spacer-like shape; (2) one of the insulating film and the charge holding film is formed and then etched back under an appropriate condition so that the film retains the shape of the side wall spacer. Thereafter, the other one of the insulating film and the charge holding film is formed and then etched back similarly so that the film retains the side-wall-spacer-like shape; (3) An insulating film material in which particles of a charge holding material are dispersed is applied or deposited on the semiconductor layer including the gate electrode, thereby forming a film of the insulating material. The film is etched back under an appropriate condition so that the insulating film material retains the side-wall-spacer-like shape; (4) after forming the gate electrode, the single-layered film or the laminated film mentioned above is formed, and then subjected to patterning by using a mask; and (5) the like methods. Moreover, the memory element may be formed by the following method or the like method: before forming the gate electrode, formed is the charge holding film, the laminate film structured as charge holding film/insulating film, the laminate film structured as insulating film/charge holding film/insulating film, or the like film. And then, an aperture is formed in a region that is to be the channel region of the film. After that, the film of the gate electrode material is formed all over the aperture. Subsequently, the film of the gate electrode material is patterned in a shape that includes the aperture and is larger than the aperture.

How to form the memory element in this method is explained below, referring to a memory element shown in FIG. 8. To begin with a gate insulating film 214 and a gate electrode 217 are formed on a semiconductor substrate 211 via a well-known process. Next, on a whole surface of the semiconductor substrate 211, a silicon oxide film 241 is formed by the thermal oxidation method or deposited by the CVD (Chemical Vapor Deposition) method. The silicon oxide film 241 has a thickness of 0.8 nm to 20 nm, preferably of 3 nm to 10 nm. Then, on a whole surface of the silicon oxide film 241, a silicon nitride film 242 is deposited by the CVD method, the silicon nitride film 242 having a thickness of 2 nm to 15 nm, preferably of 3 nm to 10 nm. Further, on a whole surface of the silicon nitride film, a silicon oxide film 243 having a thickness in a range of 20 nm to 70 nm is formed by the CVD method. In this way, a laminate of silicon oxide film/silicon nitride film/silicon oxide film is formed.

Next, the laminate of silicon oxide film/silicon nitride film/silicon oxide film is etched back by anisotropic etching. Thereby, memory functioning members 261 and 262 having the side-wall-spacer-like shape are formed on the gate electrode 217. The thus formed memory functioning members 261 and 262 are suitable for recording operation.

After that, diffusion regions (source/drain regions) 212 and 213 are formed by ion introduction during which the gate electrode 217 and the memory functioning members 261 and 262 having the side-wall-spacer-like shape are used as masks. After the formation of the diffusion regions 212 and 213, the silicide process and the process of forming upper wiring are performed via the well known process.

In case where a memory cell array is formed by arraying the memory elements of the present embodiment, a best arrangement of the memory element satisfy all of the followings requirements, for example: (1) gate electrodes of a plurality of memory elements are connected together and function as a word line; (2) memory functioning members are provided respectively on both sides of the word line; (3) an insulator, especially a silicon nitride film has a function of holding charges in each memory functioning member; (4) the memory functioning members are formed from ONO (Oxide Nitride Oxide) films, and the silicon nitride film has a surface that is substantially parallel to a surface of the gate insulating film; (5) the silicon nitride film inside the memory functioning member is separated from the word line and a channel region by a silicon oxide film; (6) the silicon nitride film inside the memory functioning member overlaps a diffusion region; (7) the insulating film and the gate insulating film are different in thickness, the insulating film separating, from the channel region or a semiconductor layer, the silicon nitride film having the surface that is substantially parallel to the surface of the gate insulting film; (8) writing and erasing operations of a memory element is carried out by a word line; (9) no electrode (word line) having a function of assisting the writing and erasing operations is provided on the memory functioning member; and (10) areas right under the memory functioning members and adjacent to the diffusion region respectively have high concentrations of impurity that is of the other conductivity type than the conductivity type of the diffusion region. The memory element is, however, only required to satisfy at least one of the requirements.

An especially preferable combination of the requirements is, for example, a combination of (3) the insulating body, especially the silicon nitride film has the function of holding charges in each memory functioning member; (6) the silicon nitride film inside the memory functioning member overlaps on the diffusion region; and (9) no electrode (word line) having the function of assisting the writing and erasing operations is provided on the memory functioning member.

The combination of the requirements (3) and (9) is very advantageous as described below.

To begin with, it is possible to arrange such that a bit line contact is provided closer to the memory functioning member provided on a side of the word line. Thus, data stored in memory functioning members can be maintained because the memory functioning members do not touch each other even when the memory elements get closer to each other. Therefore, the combination of the requirements (3) and (9) makes it easier to attain a finer memory element. Note that in case where charge holding regions in the memory functioning member are made of a conductor, the charge holding regions interfere each other as the memory elements get closer to each other due to capacitor coupling. As a result, the data stored in the memory functioning member cannot be maintained.

Moreover, in case where the charge holding region in the memory functioning member is an insulator (for example, the silicon nitride film), there is no need of separating a memory functioning member per memory cell. For example, memory functioning members provided on both the sides of one word line and shared between/among a plurality of memory cells need not be parted for each memory cell, and may be shared between/among the plurality of memory cells sharing the word line. Because of this, there is no need of photo-etching process that is for parting the memory functioning member. Therefore, it is possible to attain a simpler manufacturing process. Furthermore, there is no need of allowing margins for positioning in the photolithography process and for film loss caused by the etching. Therefore, it is possible to arrange the memory cells to have a smaller margin between them. Thus, if the memory cells are micro-fabricated to the same extent, the arrangement in which the charge holding area is an insulator, requires a smaller occupying area for the memory cells, compared with the arrangement in which the charge holding area in the memory functioning member is a conductor (for example, a polycrystalline silicon film). Note that the arrangement in which the charge holding area in the memory functioning member is a conductor requires the photo-etching process for parting the memory functioning member per memory cell, thus requiring a margin for positioning during light-exposure and for film loss caused by the etching.

Furthermore, in the arrangement in which the charge holding area is an insulator, no electrode having a function of assisting the writing and erasing operations is provided on the memory functioning member, and thus this arrangement has a simpler structure as to its elements. On account of this, it is possible to produce the semiconductor storage device with a higher yield via production process having a less number of steps therein. Thus, it is possible to attain a semiconductor storage device in which the memory cell is easily mounted together with a transistor constituting a logic circuit or an analog circuit, and that has a low cost.

Moreover, more effective is the arrangement in which not only the requirements (3) and (9) but also the requirement (6) is satisfied. With the arrangement in which the charge holding region in the memory functioning member overlaps the diffusion region, it is possible to perform the writing and erasing operations by using a very low voltage. Specifically, it is possible to carry out the writing and erasing operations by using a voltage of 5V or less. This advantage is quite effective in designing circuits. Because it is unnecessary to generate a high voltage in this arrangement unlike a flash memory, it is possible to omit or scale down a charge-pumping circuit that requires a huge occupying area. Especially, in case where, in a logic LSI, a memory section of small capacity is provided, for adjustment, a periphery circuit for driving a memory cell dominates in an occupying area of the memory section, rather than the memory cell. Therefore, for attaining a smaller chip size, it is most effective to omit or scale down a voltage-boosting circuit used for the memory cell.

On the other hand, in case where the requirement (3) is not satisfied, that is, where in the memory functioning member a section for holding charges is a conductor, it is possible to carry out the writing operation, even if the requirement (6) is not satisfied, that is, even if the conductor in the memory functioning member does not overlap the diffusion region. This is because the writing operation is assisted by capacitor coupling between (i) the conductor in the memory functioning member and (ii) the gate electrode. Moreover, in case where the requirement (9) is not satisfied, that is, where an electrode having the function of assisting the writing and erasing operations is provided on the memory functioning member, it is possible to perform the writing operation, even if the requirement (6) is not satisfied, that is, even if the conductor in the memory functioning member does not overlap on the diffusion region.

In the present semiconductor storage device, one of or both of the memory elements may be connected with a transistor. Further, the memory elements may be mounted, on one chip, together with a logic transistor. In those arrangements, the semiconductor storage device, especially, the memory element can be produced in a step that is highly compatible with a formation process of a standard transistor such as the transistor, the logic transistor, or the like. Thus, it is possible to form (i) the semiconductor device, especially the memory element, and (ii) the transistor or the logic transistor, in the same step. Therefore, it is possible to employ a very simple process in order to mount, on one chip, (i) the memory element and (ii) the transistor or the logic transistor. Thus, it is possible to attain, at a low cost, a device on which (i) the memory element and (ii) the transistor or the logic transistor are mounted together.

The present semiconductor storage device is so arranged that the memory element is capable of storing data of binary or more in each memory functioning member, and the memory element thereby stores quaternary or more. Note that the memory element may store binary data. Moreover, the memory element may have a function as a memory cell that acts as both a selection transistor and a memory by utilizing variable resistance property of the memory functioning member.

The present semiconductor storage device, by being combined with a logic element or a logic circuit, can be used in electronic apparatuses as follows: (1) data processing systems for personal computers, notebook-type computers, laptop-type computers, personal digital assistants/personal communicators, minicomputers, work stations, mainframes, multiprocessor computers, any others types of computers, and the like; (2) electronic parts constituting data processing systems for CPUs, memories, data storage devices, and the like; (3) communication apparatuses such as telephones, PHSs (devices for the personal handy-phone system), modems, routers, and the like; (4) image display apparatuses such as display panels, projectors and the like; (5) offices machines such as printers, scanner, photocopying machines; (6) imaging apparatuses such as video cameras, digital cameras, and the like; (7) entertainment/amusement apparatuses such as game machines, music players, and the like; (8) information apparatuses such as portable information terminals, watches/clocks, electronic dictionaries, and the like; (9) apparatus for use in automobiles, such as car navigation system devices, car audio devices, and the like; (10) audiovisual apparatuses for recording/reproducing data for moving pictures, still pictures, music (sounds) and the like; (11) electric appliances such as washing machines, microwave ovens, refrigerators, rice cookers, dish washers, cleaners, air conditioners, and the like; (12) apparatuses for health care, such as massaging apparatuses, weighing machines, blood-pressure meters, and the like; (13) portable storage devices such as IC cards, memory cards and the like; (14) and the like. Especially, the present semiconductor storage device is effectively applicable in portable electronic apparatuses such as portable telephones, portable information terminals, IC cards, memory cards, portable computers, portable game machines, digital cameras, portable moving-picture players, portable music players, electronic dictionaries, watches, and the like. Note that the present semiconductor storage device may be built, as at least part of a control circuit or a data storage circuit, in the electronic apparatuses, or may be detachably provided to the electronic apparatuses.

Embodiment 1

A semiconductor storage device of the present embodiment includes a memory element 1 as shown in FIG. 1.

The memory element 1 is arranged such that a gate electrode 104 is formed via a gate insulating film 103 on a P-type well region 102 which is formed on the surface of a semiconductor substrate 101. On the upper surface and side surfaces of the gate electrode 104, arranged is a silicon nitride film 109 which is a charge holding film, holding charges at a trap level. The portions of the silicon nitride film 109 on the both side walls serve as memory functional sections 105a and 105b where charges are actually held. Here, the memory functional section indicates a section where charges are actually accumulated by rewriting operation in a memory functioning member or a charge holding film. In the P-type well region 102 on the opposite sides of the gate electrode 104, formed are N-type diffusion regions 107a and 107b which function as source region or drain region. The diffusion regions 107a and 107b have an offset structure. That is, neither the diffusion regions 107a nor 107b extend to an region 121 under the gate electrode 104, and offset regions 120 under the charge holding film constitute a part of the channel region.

Note that, the memory functional sections 105a and 105b substantially holding charges are portions on the both side walls of the gate electrode 104. Therefore, only the regions corresponding to these portions should include the silicon nitride film 109 formed thereon (see FIG. 2(a)). The memory functional sections 105a and 105b may have a structure in which fine particles 111 each realized by a nanometer-size electric conductor or semiconductor are dispersed in an insulating film 112 (see FIG. 2(b)). At this moment, the fine particle 111 having a diameter of less than 1 nm, which produces too large quantum effects, makes it difficult that a charge tunnels through a dot. However, the fine particle 111 having a diameter of more than 10 nm do not produce significant quantum effects at room temperature. Therefore, it is preferable that the fine particle 111 is in the 1 nm to 10 nm diameter range. Moreover, the silicon nitride film 109, a charge holding film, may be formed in a sidewall-spacer manner on the side surfaces of the gate electrode (see FIG. 3).

A principle of the writing operation by a memory element will be described with reference to FIG. 3 and FIG. 4. Note that, the following description is given based on the case where both of first memory functioning member 131a and second memory functioning member 131b have functions of holding charges. Writing operation indicates an operation of injecting electrons into the memory functioning members 131a and 131b when the memory element is a N-channel type memory element. The following description assumes that the memory element is a N-channel type memory element.

Figure 3:
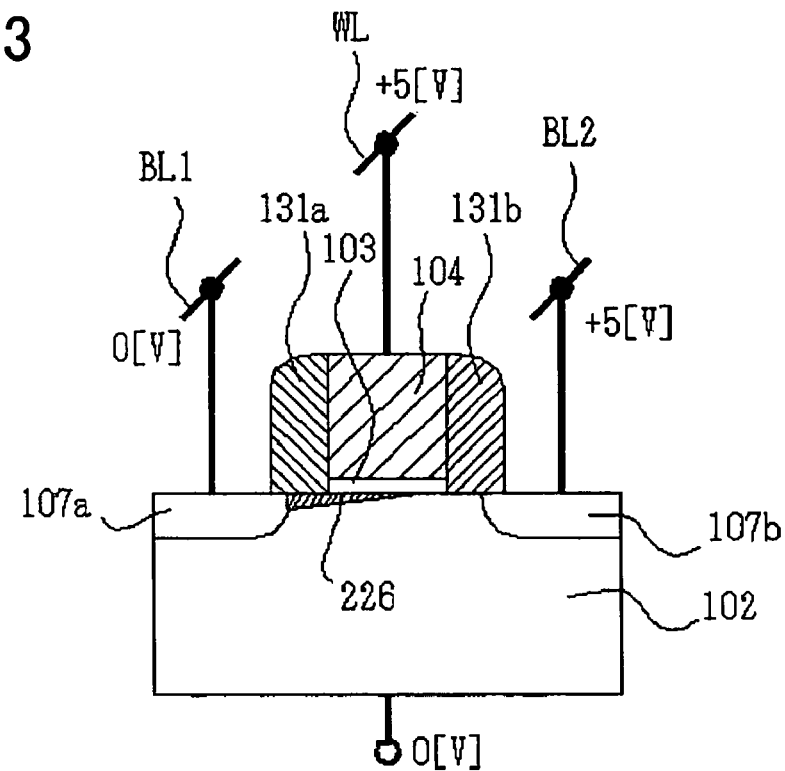
FIG. 3 is a drawing illustrating a write operation of a memory element in the semiconductor memory device in accordance with embodiment 1 of the present invention.

For injection (writing) of electrons into the second memory functioning member 131b, assume that an N-type first diffusion region 107a is a source electrode, and an N-type second diffusion region 107b is a drain electrode, as shown in FIG. 3. For example, a voltage of 0V is applied to the N-type first diffusion region 107a and the P-type well region 102, a voltage of +5V is applied to the N-type second diffusion region 107b, and a voltage of +5V is applied to the gate electrode 104. Under such voltage conditions, an inversion layer 226 extends from the first diffusion region 107a (source electrode), but it does not reach the second diffusion region 107b (drain electrode), which causes a pinch-off point. Electrons are accelerated from the pinch-off point to the second diffusion region 107b (drain electrode) with the application of a high electric field, thus turning to so-called hot electrons (high-energy conduction electrons). These hot electrons are injected into the second memory functioning member 131b, whereby writing operation is carried out. Note that, no hot electrons occur near the first memory functioning member 131a, hence writing operation is not carried out.

Figure 4:
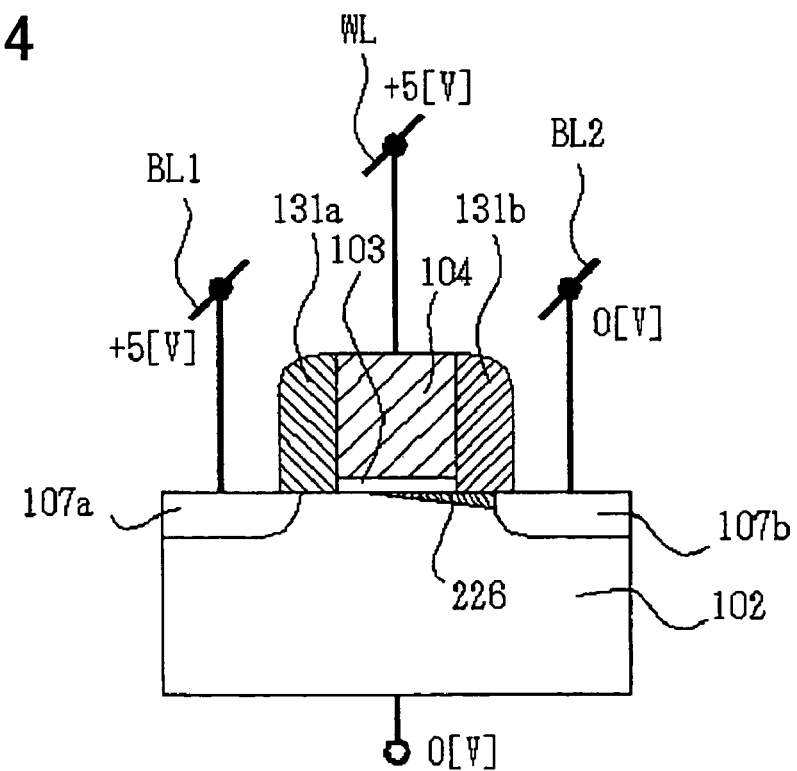
FIG. 4 is a drawing illustrating another write operation of a memory element in the semiconductor memory device in accordance with embodiment 1 of the present invention.

Meanwhile, for injection (writing) of electrons into the first memory functioning member 131a, assume that the second diffusion region 107b is a source electrode, and the first diffusion region 107a is a drain electrode, as shown in FIG. 4. For example, a voltage of 0V is applied to the second diffusion region 107b and the P-type well region 102, a voltage of +5V is applied to the first diffusion region 107a, and a voltage of +5V is applied to the gate electrode 104. Thus, places between source region and drain region is changed from the places in the case when electrons are injected into the second memory functioning member 131b, whereby electrons are injected into the first memory functioning member 131a, thus carrying out writing operation.

Figure 5:
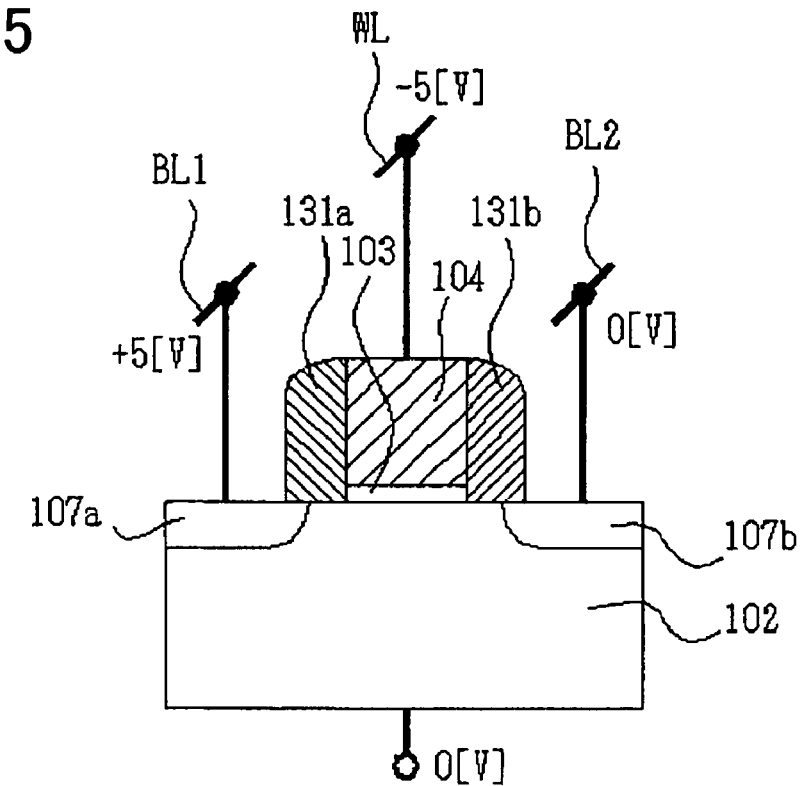
FIG. 5 is a drawing illustrating an erase operation of a memory element in the semiconductor memory device in accordance with embodiment 1 of the present invention.
Figure 6:
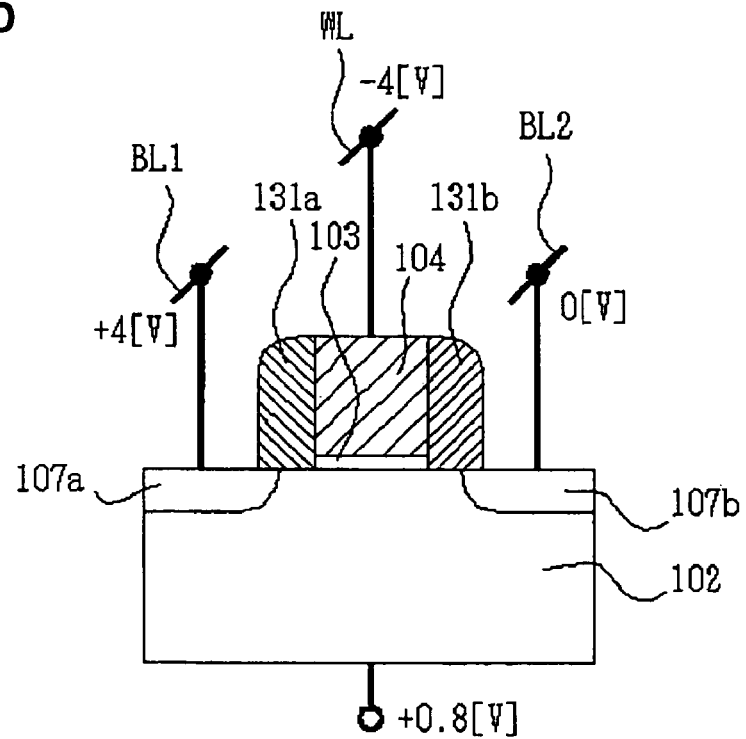
FIG. 6 is a drawing illustrating another erase operation of a memory element in the semiconductor memory device in accordance with embodiment 1 of the present invention.

Next, the following will describe a principle of erasing operation in the memory element with reference to FIG. 5 and FIG. 6.

In the first erasing method of erasing information stored in the first memory functioning member 131a, as shown in FIG. 5, a positive voltage (for example, +5V) is applied to the first diffusion region 107a, and a voltage of 0V is applied to the P-type well region 102 so that a p-n junction between the first diffusion region 107a and the P-type well region 102 is reverse biased, and further, a negative voltage (for example, −5V) is applied to the gate electrode 104. At this moment, because of application of the negative voltage to the gate electrode, a potential gradient especially becomes steep in the vicinity of the gate electrode 104 of the p-n junction. Therefore, hot holes (high-energy positive holes) are induced in the P-type well region 102 of the p-n junction by band-to-band tunneling. The hot holes are attracted in the direction of the gate electrode 104 having negative potential, which results in hole injection in the first memory functioning member 131a. In this manner, erasing operation in the first memory functioning member 131a is carried out. In this case, it is safe that a voltage of 0V may be applied to the second diffusion region 107b.

For erasing of information stored in the second memory functioning member 131b, it is safe that potentials are changed between the first diffusion region and the second diffusion region in the above first method. In the second erasing method of erasing information stored in the first memory functioning member 131a, as shown in FIG. 6, a positive voltage (for example, +4V) is applied to the first diffusion region 107a, a voltage of 0V is applied to the second diffusion region 107b, a negative voltage (for example, −4V) is applied to the gate electrode 104, and a positive voltage (for example, +0.8V) is applied to the P-type well region 102. At this moment, a forward voltage is applied between the P-type well region 102 and the second diffusion region 107b, causing electrons to be injected into the P-type well region 102. The injected electrons are diffused to the p-n junction between the P-type well region 102 and the first diffusion region 107a and then accelerated with the application of a strong-electric field, thus turning to hot electrons. These hot electrons causes electron-hole pairs generated at the p-n junction. That is, application of a forward voltage between the P-type well region 102 and the second diffusion region 107b causes electrons injected into the P-type well region 102 to trigger the generation of hot holes at the p-n junction located on the opposite side. The hot holes generated at the p-n junction are attracted in the direction of the gate electrode 104 having negative potential, which results in hole injection in the first memory functioning member 131a.

According to the method, at the p-n junction between the P-type well region and the first diffusion region 107a, even when a voltage insufficient for the induction of hot holes by band-to-band tunneling is applied, the electrons injected from the second diffusion region 107b trigger the generation of electron-hole pairs at the p-n junction, thus generating hot holes. This makes it possible to decrease a voltage during the erasing operation. Especially, if there exists an offset region 120 (see FIG. 1), the gate electrode to which a negative potential is applied reduces the effect of providing a sharp p-n junction. This has a difficulty of inducing hot holes by band-to-band tunneling; however, the second method compensates for this drawback, thus realizing erasing operation at a low voltage.

Note that, for erasing of information stored in the first memory functioning member 131a, the first erasing method requires a voltage of +5V applied to the first diffusion region 107a. However, in the second erasing method, a voltage of +4V is enough for the erasing. Thus, according to the second erasing method, it is possible to decrease a voltage during the erasing operation, so that power consumption is reduced, thus suppressing deterioration of the memory element caused by hot carriers.

Moreover, the both erasing methods are less prone to causing overerase phenomenon. The overerase phenomenon is a phenomenon in which as the amount of positive holes accumulated in a memory functioning member increases, a threshold value decreases without saturating. For EEPROM typified by flash memory, the overerase phenomenon is a big problem and causes such a fatal malfunction that selection of memory cell is impossible especially when the threshold value becomes negative. On the other hand, in the memory element of the present semiconductor storage device, a large amount of positive holes accumulated in the memory functioning member only induces electrons under the memory functioning member and has little influence on the potential of the channel region under the gate insulating film. The threshold value during the erasing operation is determined depending on the potential under the gate insulating film, thus it is more likely that no overerase phenomenon occurs.

Figure 7:
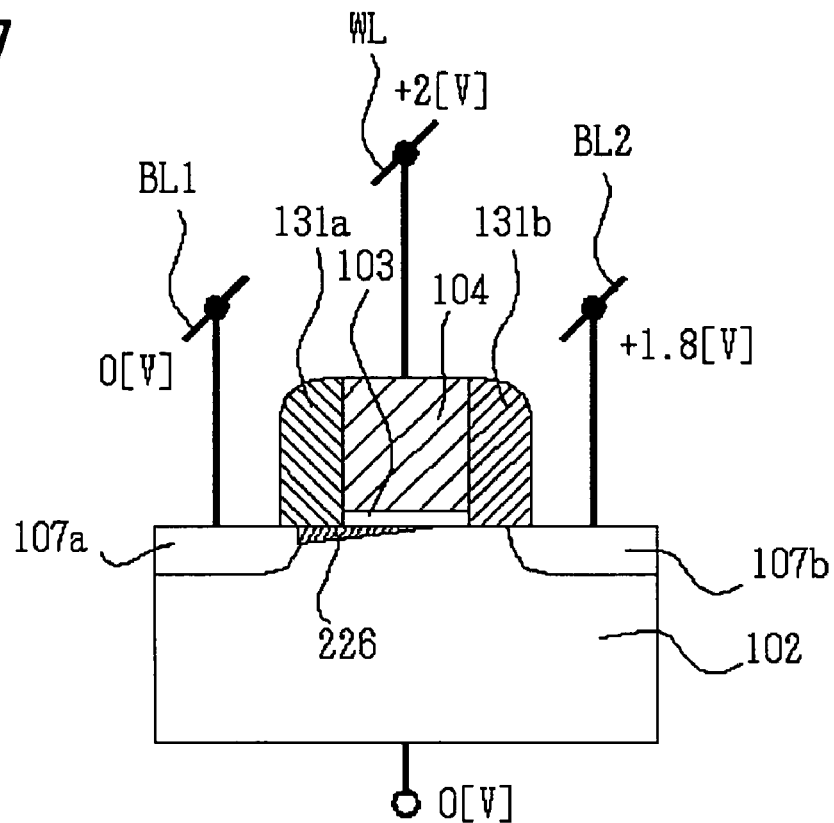
FIG. 7 is a drawing illustrating a read operation of a memory element in the semiconductor memory device in accordance with embodiment 1 of the present invention.

Furthermore, the following will describe a principle of read-out operation in the memory element with reference to FIG. 7.

For read-out of information stored in the first memory functioning member 131a, a transistor is activated under the condition where the first diffusion region 107a is a source electrode, and the second diffusion region 107b is a drain electrode. For example, a voltage of 0V is applied to the first diffusion region 107a and the P-type well region 102, a voltage of +1.8V is applied to the second diffusion region 107b, and a voltage of +2V is applied to the gate electrode 104. At this moment, when electrons are not accumulated in the first memory functioning member 131a, a drain current is more likely to flow. On the other hand, when electrons are accumulated in the first memory functioning member 131a, an inversion layer is less prone to being generated in the vicinity of the first memory functioning member 131a, so that a drain current is less prone to flowing. Therefore, it is possible to read out information stored in the first memory functioning member 131a by detecting a drain current. Especially, in the case where information is read out with the application of such a voltage that would effect pinch-off operation, the state of charges accumulated in the first memory functioning member 131a can be judged with higher accuracy regardless of the presence or absence of charges accumulated in the second memory functioning member 131b.

For read-out of information stored in the second memory functioning member 131b, a transistor is activated under the condition where the second diffusion region 107b is a source electrode, and the first diffusion region 107a is a drain electrode. For example, it is safe that a voltage of 0V is applied to the second diffusion region 107b and the P-type well region 102, a voltage of +1.8V is applied to the first diffusion region 107a, and a voltage of +2V is applied to the gate electrode 104. Thus, places between source region and drain region are changed from the places in the case when information stored in the first memory functioning member 131a is read out, whereby it is possible to read out information stored in the second memory functioning member 131b.

Note that, when there remains a channel region (offset region 120) not covered by the gate electrode 104, an inversion layer is erased or generated depending on the presence or absence of surplus charges in the memory functioning members 131a and 131b. As a result of this, a large hysteresis (change in threshold value) can be obtained. Note that, too much width of the offset region 120 causes a considerable decrease in the amount of drain current and a dramatic decrease in read-out speed. Therefore, it is preferable to determine a width of the offset region 120 so that sufficient hysteresis and read-out speed can be obtained.

In the case where the diffusion regions 107a and 107b reach the edges of the gate electrode 104, that is, in the case where the diffusion regions 107a and 107b overlap the gate electrode 104, a transistor exhibits little change in threshold value by writing operation, but exhibits a dramatic change in parasitic resistance at the edges of the source and drain regions, decreasing the amount of drain current (decreasing by one or more orders of magnitude). Therefore, read-out can be carried out by detecting a drain current, and it is possible to obtain functions serving as a memory. Note that, when larger hysteresis effect is required, it is preferable that the diffusion regions 107a and 107b do not overlap the gate electrode 104 (the offset regions 120 exist).

By the above operating methods, one transistor can selectively carry out 2-bit writing and erasing. Memory elements are arranged such that a word line WL, a first bit line BL1, and a second bit line BL2 are respectively connected to the gate electrode 104, the first diffusion region 107a, and the second diffusion region 107b in the memory element, thereby making up a memory cell array.

Moreover, in the above operating methods, a changing of places between source electrode and drain electrode realizes 2-bit writing and erasing in one transistor. However, places of the source electrode and drain electrode may be fixed so that the transistor can operate as one bit of memory. In this case, one of the source region and the drain region can be a common fixed voltage, thereby halving the number of bit lines connected to the source region and the drain region.

As is clear from the above description, in a memory element of the present semiconductor storage device, memory functioning members are provided independently from the gate insulating film and provided on the opposite sides of the gate electrode, so that 2-bit operations are possible. Further, since the memory functioning members are isolated from each other by the gate electrode, interference between them during writing operation is effectively suppressed. Still further, since the gate insulating film is isolated from the memory functioning members, the thickness of the memory functioning members is reduced, thereby suppressing a short channel effect. This facilitates realization of a finer memory element, and by extension, realization of a finer semiconductor storage device.

Embodiment 2

Figure 8:
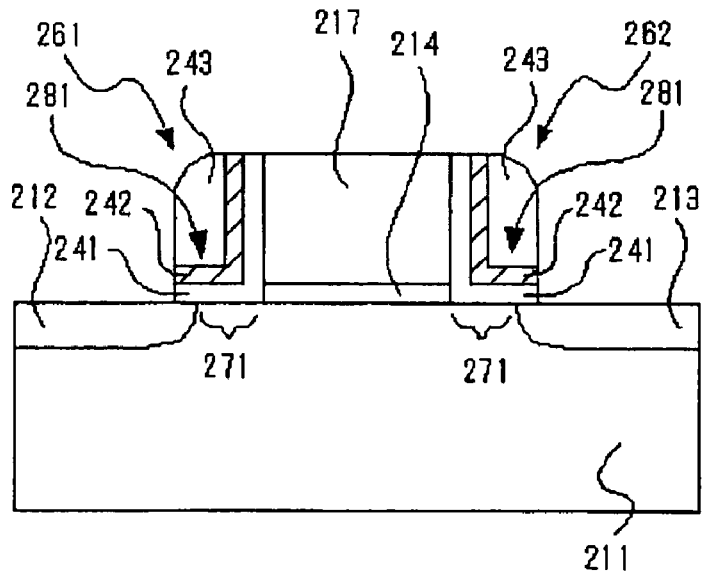
FIG. 8 is a schematic cross-sectional view showing a major part of a memory element in a semiconductor memory device in accordance with embodiment 2 of the present invention.

A memory element in a semiconductor storage device of the present embodiment, as shown in FIG. 8, has substantially the same arrangement as that of the memory element 1 in FIG. 1, except for the arrangement in which each memory functioning members 261 and 262 is constituted by a region where charges are held (this region is a region where charges are accumulated and may be a film having a function of holding charges) and a region where charges are less prone to escaping (this region may be a film having a function of making charges less prone to escaping).

In terms of improvement in holding property of memory, the memory functioning members preferably include an insulating film and a charge holding film capable of holding charges. In the present embodiment, a silicon nitride film 242 having a level of trapping charges is used as a charge holding film, and silicon oxide films 241 and 243 capable of preventing the dissipation of charges accumulated in the charge holding film are used as insulating films. The memory functioning member including the charge holding film and the insulating films prevents the dissipation of charges, thereby improving holding property. Moreover, as compared to the constitution of the memory functioning member including the charge holding film alone, the above constitution of the memory functioning member can reduce the volume of the charge holding film to an appropriately small volume, and can restrict transfer of charges inside the charge holding film, thereby suppressing changes of properties caused by the transfer of charges during memory holding. Further, the structure in which the silicon nitride film 242 is sandwiched between the silicon oxide films 241 and 243 enhances a charge injection efficiency during rewriting operation, thus allowing for a higher-speed operation. Note that, in this memory element, the silicon nitride film 242 may be substituted with a ferroelectric substance.

The regions where charges are held (silicon nitride film 242) in the memory functioning members 261 and 262 overlap diffusion regions 212 and 213, respectively. To "overlap" means that at least a part of the region where charges are held (silicon nitride film 242) exists above at least a part of each of the diffusion regions 212 and 213. Note that, reference numeral 211 represents a semiconductor substrate, reference numeral 214 represents a gate insulating film, reference numeral 217 represents a gate electrode, reference numeral 271 represents an offset region of the gate electrode 217 and each of the diffusion regions 212 and 213. An upper surface of the semiconductor substrate 211 beneath the gate insulating film 214 is a channel region (not shown). The following will describe effects brought by the arrangement where the silicon nitride films 242, which are regions where charges are held in the memory functioning members 261 and 262, overlap the diffusion regions 212 and 213.

Figure 9:
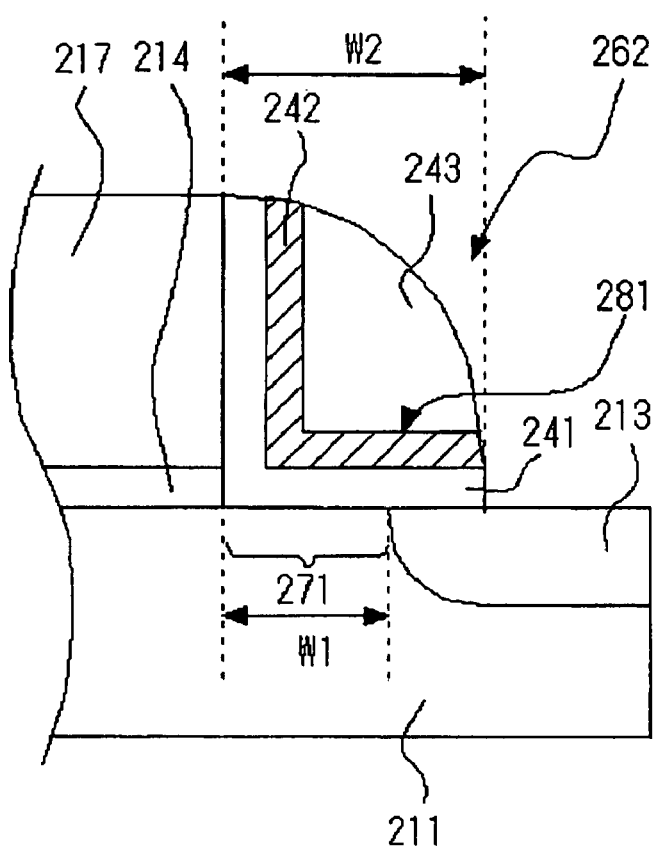
FIG. 9 is a schematic enlarged cross-sectional view of a major part in FIG. 8.

As shown in FIG. 9, in the periphery of the memory functioning member 262, when the amount of offset between the gate electrode 217 and the diffusion region 213 is W1, and a width of the memory functioning member 262 in a cross section in the channel length direction of the gate electrode is W2, the amount of overlap between the memory functioning member 262 and the diffusion region 213 is expressed by W2−W1. Here, it is important that the part including the silicon nitride film 242 in the memory functioning member 262 overlaps the diffusion region 213, that is, the relation W2>W1 is satisfied.

Figure 10:
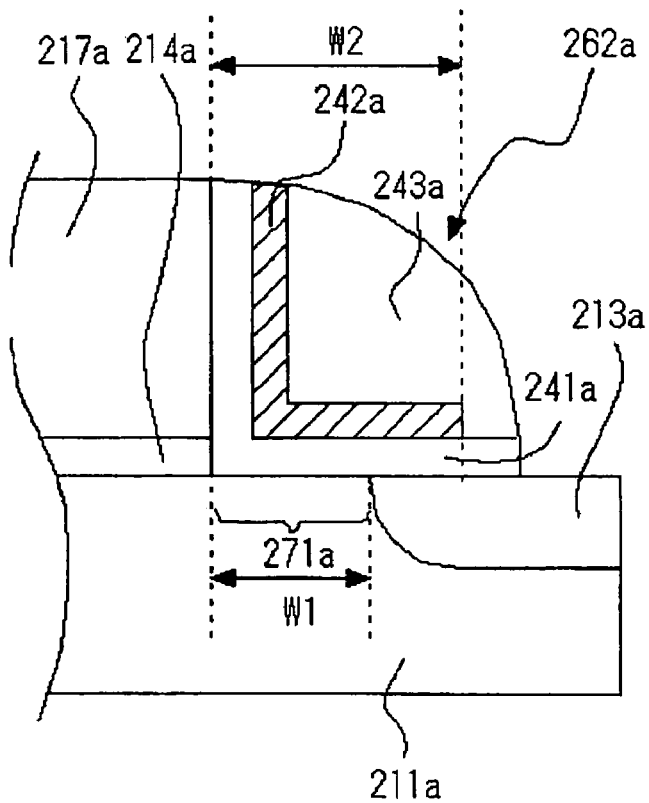
FIG. 10 is a schematic enlarged cross-sectional view of a major part of a variation of FIG. 8.

In FIG. 9, a width of the memory functioning member 262 is denoted by W2 because the edge of the silicon nitride film 242 on the side distant from the gate electrode 217 matches the edge of the memory functioning member 262 on the side distant from the gate electrode 217. However, as shown in FIG. 10, when the edge of the silicon nitride film 242a on the side distant from the gate electrode does not match the edge of the memory functioning member 262a on the side distant from the gate electrode, W2 should be defined as the distance from the edge of the gate electrode to the edge of the silicon nitride film 142a on the side distant from the gate electrode.

Figure 11:
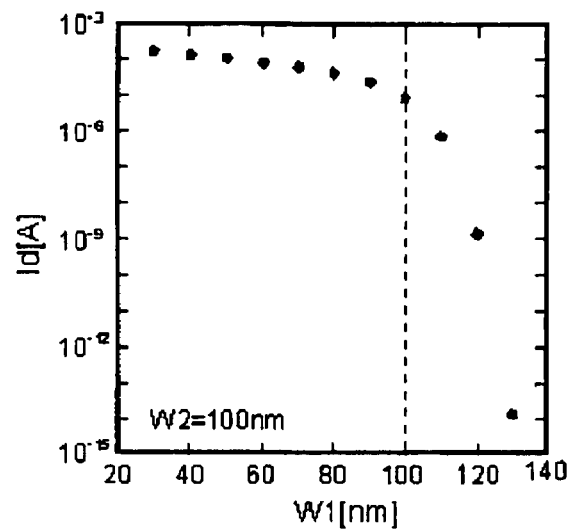
FIG. 11 is graph illustrating an electric property of a memory element in the semiconductor memory device in accordance with embodiment 2 of the present invention.

FIG. 11 shows a drain current Id with changes in the amount of offset W1 when the width W2 of the memory functioning member 262 is fixed to 100 nm in a structure of the memory element in FIG. 9. Here, values of the drain current were obtained by a device simulation under the condition where the memory functioning member 262 is in an erased state (includes holes accumulated therein) and the diffusion regions 212 and 213 are source electrode and drain electrode, respectively. As is apparent from FIG. 11, when W1 is 100 nm or more (that is, the silicon nitride film 242 does not overlap the diffusion region 213), the drain current decreases rapidly. The value of the drain current is appropriately in proportion to a read-out speed. Therefore, when W1 is 100 nm or more, the performance of memory is rapidly degraded. On the other hand, when W1 is a value in the range where the silicon nitride film 242 overlaps the diffusion region 213, the drain current decreases moderately. Therefore, considering that variations in mass production process, if at least a part of the silicon nitride film 242, which is a film capable of holding charges, does not overlap the source region and drain region, it is practically difficult to obtain memory function.

In view of the result of the above-mentioned device simulation, memory cell arrays with W1 of 60 nm and 100 nm as design value were prepared under the condition where W2 is fixed to 100 nm. When W1 is 60 nm, there is an overlap of 40 nm as a design value between the silicon nitride film 142 and the diffusion regions 212 and 213. When W1 is 100 nm, there is no overlap between them. When comparing to results of a read-out time measurement between these memory cell arrays in the worst cases considering variations, the memory cell array with W1 of 60 nm reads at a speed of 100 times faster in a read-out access time than the memory cell array with W1 of 100 nm. Practically, a read-out access time is preferably 100 nanoseconds or less per bit; however, when W1=W2, it is impossible to achieve this condition. In view of variations in manufacturing process, (W2−W1)>10 nm is more preferable.

For read-out of information stored in the memory functioning member 261 (region 281), as in the case of Embodiment 1, it is preferable that the diffusion region 212 and the diffusion region 213 are source electrode and drain region, respectively, and a pinch-off point is formed in the channel region, at a point closer to the drain region. That is, in reading out information stored in one memory functioning member of two memory functioning members, a pinch-off point is preferably formed in the channel region, in a region closer to the other memory functioning member. This makes it possible to detect information stored in the memory functioning member 261 at a good sensitivity regardless of storage conditions in the memory functioning member 262. This is a great factor for the realization of two-bit operation.

On the other hand, when information is let stored in only one memory functioning member of two memory functioning members, or when the two memory functioning members are used with the same storage conditions, the formation of a pinch-off point is not always needed for read-out operation. Note that, it is preferable that a well region (for N channel element, P-type well), not shown in FIG. 8, is formed on the surface of the semiconductor substrate 211. The formation of a well region facilitates control of other electric properties (property of withstanding voltage, junction capacitance, short channel effect) while optimizing impurity concentration in the channel region for memory operations (writing operation and read-out operation).

Figure 12:
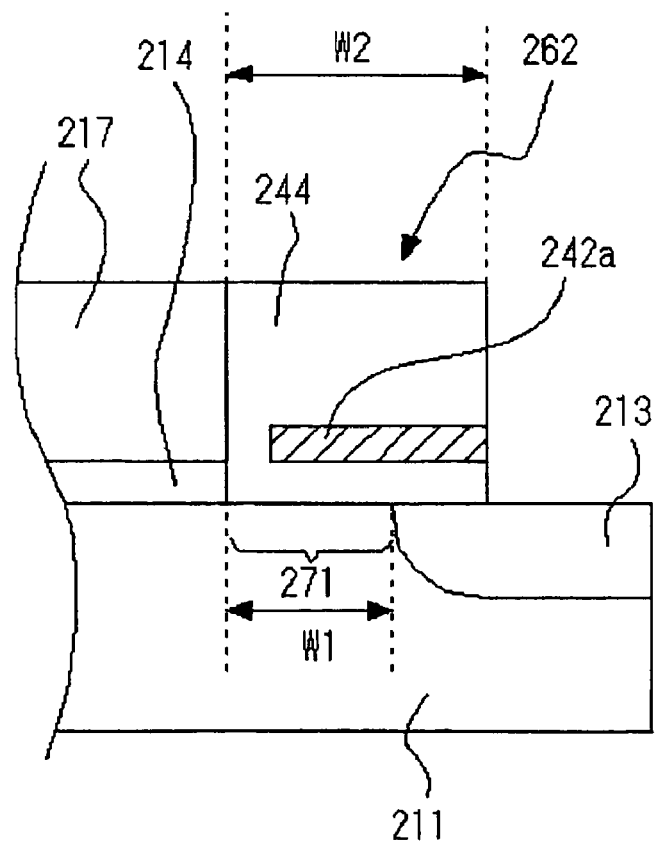
FIG. 12 is a schematic cross-sectional view of a major part of a variation of the memory element in the semiconductor memory device in accordance with embodiment 2 of the present invention.

It is preferable that the memory functioning member includes a charge holding film arranged substantially parallel to the surface of the gate insulating film. In other words, it is preferable that the upper surface of the charge holding film in the memory functioning member is arranged so as to be located at a place a given distance from the upper surface of the gate insulating film. Specifically, as shown in FIG. 12, the silicon nitride film 242a, which is a charge holding film in the memory functioning member 262, has a surface substantially parallel to the surface of the gate insulating film 214. In other words, it is preferable that the silicon nitride film 242a is formed at a uniform height from the level corresponding to the surface of the gate insulating film 214.

Existence of the silicon nitride film 242a which is substantially parallel to the surface of the gate insulating film 214 in the memory functioning member 262 can effectively control the tendency of forming an inversion layer in the offset region 271 by the amount of charges accumulated in the silicon nitride film 242a, and by extension can enhance a memory effect. Further, the arrangement in which the silicon nitride film 242a is substantially parallel to the surface of the gate insulating film 214 can reduce a change of memory effect to a relatively small change even when the amount of offset (W1) varies, thus suppressing varying degrees of memory effect. In addition, it is possible to suppress upward transfer of charges in the silicon nitride film 242a and to prevent changes in properties during memory holding, caused by transfer of charges.

Further, it is preferable that the memory functioning member 262 includes the insulating film (For example, a portion in the silicon oxide film 244 on the offset region 271) isolating the silicon nitride film 242a, which is substantially parallel to the surface of the gate insulating film 214, from the channel region (or well region). This insulating film prevents the dissipation of charges accumulated in the charge holding film, thus attaining a memory element having a much better holding property.

Note that, by controlling a film thickness of the silicon nitride film 242a and by controlling a film thickness of the insulating film (a portion of the silicon oxide film 244 above the offset region 271) beneath the silicon nitride film 242a to uniform thickness, it is possible to maintain a distance from the surface of the semiconductor substrate to charges accumulated in the charge holding film to a substantially uniform distance. That is, a distance from the surface of the semiconductor substrate to charges accumulated in the charge holding film can be controlled to a distance value between a minimum value of film thickness of the insulating film beneath the silicon nitride film 242a and a sum of a maximum value of film thickness of the insulating film beneath the silicon nitride film 242a and a maximum value of film thickness of the silicon nitride film 242a. This makes it possible to control a density of electric flux lines caused by charges accumulated in the silicon nitride film 242a and to extremely reduce varying degrees of memory effect of the memory element.

Embodiment 3

Figure 13:
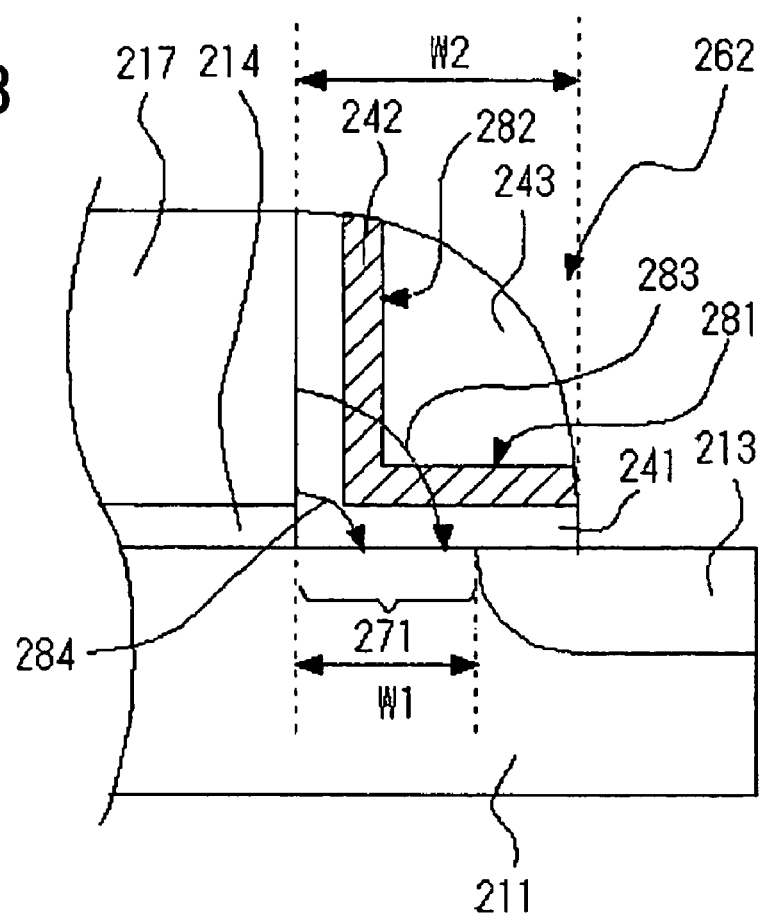
FIG. 13 is a schematic cross-sectional view of a major part of a memory element in a semiconductor memory device in accordance with embodiment 3 of the present invention.

As shown in FIG. 13, a memory functioning member 262 in the semiconductor storage device of the present embodiment includes a silicon nitride film 242, which is a charge holding film, with substantially uniform film thickness, having a region 281 which is arranged substantially parallel to the surface of the gate insulating film 214 and a region 282 which is arranged substantially parallel to the side surface of the gate electrode 217.

When a positive voltage is applied to a gate electrode 217, an electric flux line 283, as indicated by arrow, in a memory functioning member 262 passes through the silicon nitride film 242 twice (the region 282 and the region 281). Note that, when a negative voltage is applied to the gate electrode 217, an electric flux line reverses its direction. Here, the silicon nitride film 242 has a relative permittivity of approximately 6, and the silicon oxide films 241 and 243 have a relative permittivity of approximately 4. This arrangement of the present embodiment can make an effective relative permittivity in the direction of the electric flux line larger and make difference in potential between both ends of the electric flux line smaller than the arrangement in which the region 281 alone exists in the charge holding film. That is, a large part of the voltage applied to the gate electrode 217 is used to strengthen an electric field in the offset region 271.

Injection of charges into the silicon nitride film 242 during rewriting operation occurs because generated charges are attracted by an electric filed in the offset region 271. Therefore, inclusion of the charge holding film indicated by the arrow 282 increases the amount of charges injected into the memory functioning member 262 during rewriting operation, thus increasing a rewriting speed. Note that, if the part corresponding to the silicon oxide film 243 is also a silicon nitride film, that is, the charge holding film is not at a uniform height with respect to the level of the surface of the gate insulating film 214, upward transfer of charges in the silicon nitride film becomes pronounced, resulting in degrading of holding property.

It is more preferable that the charge holding film is made up of dielectric material such as hafnium oxide having a very high relative permittivity, instead of silicon nitride film. Further, it is preferable that the memory functioning member further includes an insulating film (a portion in the silicon oxide film 241 above the offset region 271) isolating the charge holding film, which is substantially parallel to the surface of the gate insulating film, from a channel region (or well region). This insulating film prevents the dissipation of charges accumulated in the charge holding film, further enhancing holding property.

Moreover, it is preferable that the memory functioning member further includes an insulating film (a portion of the silicon oxide film 241 in contact with the gate electrode 217) isolating the gate electrode from the charge holding film extending substantially parallel to the side surface of the gate electrode. This insulating film prevents change in electric properties caused by injection of charges from the gate electrode to the charge holding film, thus enhancing reliability of a memory element. Further, as in the case of Embodiment 2, it is preferable that a film thickness of an insulating film (a portion of the silicon oxide film 241 above the offset region 271) beneath the silicon nitride film 242 is controlled to a uniform thickness, and a film thickness of an insulating film (a portion of the silicon oxide film 241 in contact with the gate electrode 217) arranged on the side surface of the gate electrode is controlled to a uniform thickness. This makes it possible to generally control a density of electric flux lines which are caused by charges accumulated in the silicon nitride film 242 and to prevent leakage of charges.

Embodiment 4

In the present embodiment, the following will describe optimization of a length of a gate electrode, a distance between memory functioning members, and a distance between a source region and a drain region in a memory element of a semiconductor storage device.

Figure 14:
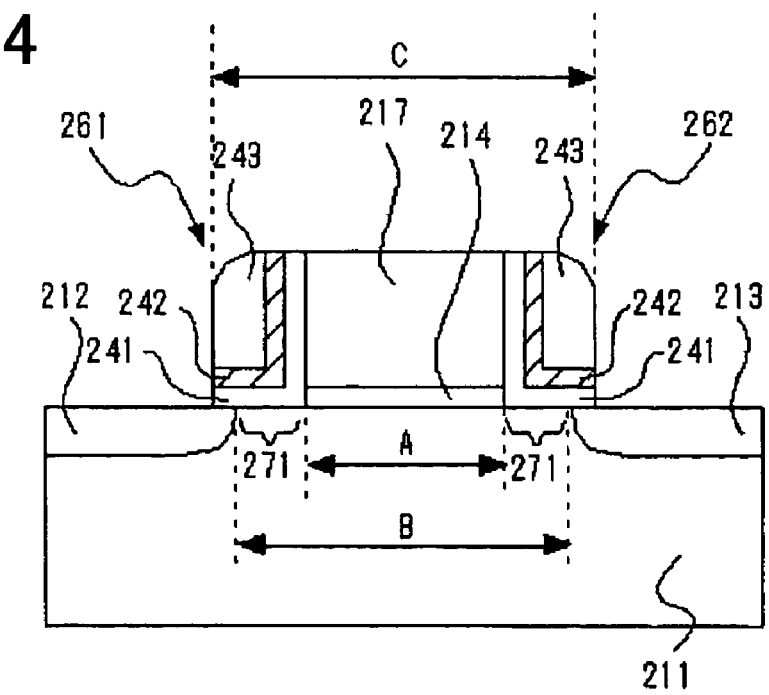
FIG. 14 is a schematic cross-sectional view of a major part of a memory element in a semiconductor memory device in accordance with embodiment 4 of the present invention.

As shown in FIG. 14, A denotes a length of a gate electrode in a cross section in the channel length direction, B denotes a distance (channel length) between a source region and a drain region, and C denotes a distance from the edge of one memory functioning member to the edge of the other memory functioning member, that is, a distance from the edge of a film capable of holding charges in one memory functioning member in a cross section in the channel length direction (the edge of the film which is distant from the gate electrode) to the edge of a film capable of holding charges in the other memory functioning member (the edge of the film which is distant from the gate electrode).

In such a memory element, B<C is preferable. By satisfying such a relation, there exists offset regions 271 between a part of the channel region located beneath the gate electrode 217 and a diffusion region 212 and between the part of the channel region located beneath the gate electrode 217a and a diffusion region 213. With this arrangement, in all of the offset regions 271, easiness of inversion effectively varies depending on charges accumulated in the memory functioning members 261 and 262 (silicon nitride films 242). This causes enhancement in memory effect and especially realizes speedup of read-out operation.

When there exists offsets between the gate electrode 217 and the diffusion region 212 and between the gate electrode 217 and the diffusion region 213, that is, when A<B, easiness of inversion in the offset regions when a voltage is applied to the gate electrode drastically varies depending on the amount of charges accumulated in the memory functioning members, thus realizing enhancement in memory effect, and especially reduction in short channel effect.

Incidentally, existence of the offset regions 271 is not always needed as long as memory effect shows up. In the case where the offset regions 271 do not exist, if impurity concentration in the diffusion regions 212 and 213 is low enough, memory effect can show up in the memory functioning members 261 and 262 (silicon nitride films 242). In view of this, A<B<C is the most preferable relation.

Embodiment 5

Figure 15:
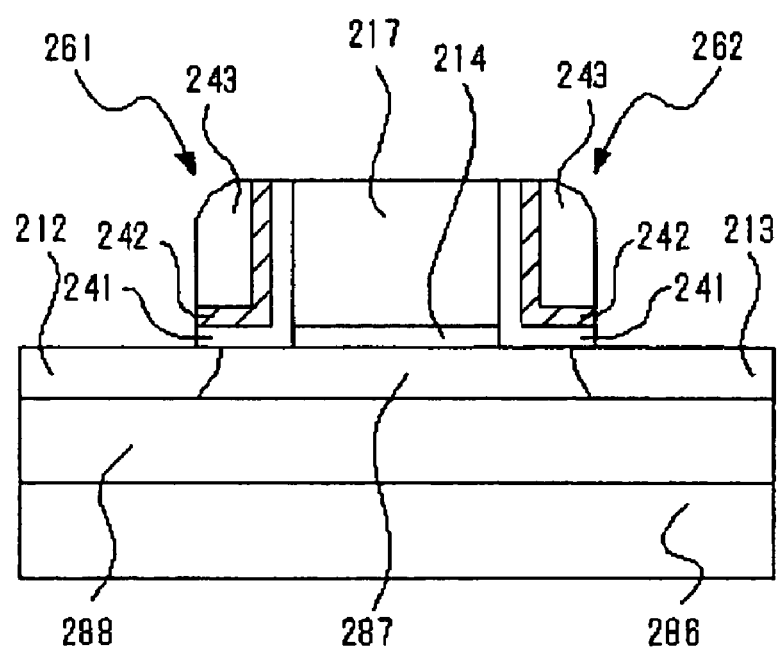
FIG. 15 is a schematic cross-sectional view of a major part of a memory element in a semiconductor memory device in accordance with embodiment 5 of the present invention.

As shown in FIG. 15, a memory element in a semiconductor storage device of the present embodiment has substantially the same arrangement as that of the memory element in Embodiment 2, except for the arrangement in which the semiconductor substrate in Embodiment 2 is replaced with a SOI substrate.

This memory element has an arrangement in which an embedded oxide film 288 is formed on a semiconductor substrate 286, and an SOI layer is further formed thereon. The SOI layer includes diffusion regions 212 and 213 and a body region 287 which is a region except for the diffusion regions 212 and 213 in the SOI layer.

This memory element can bring about the same effect as that of the memory element in Embodiment 2. Moreover, this memory element can significantly reduce the amount of junction capacitance of the diffusion regions 212 and 213 and the body region 287, thus allowing for speedup of a device and lower power consumption.

Embodiment 6

Figure 16:
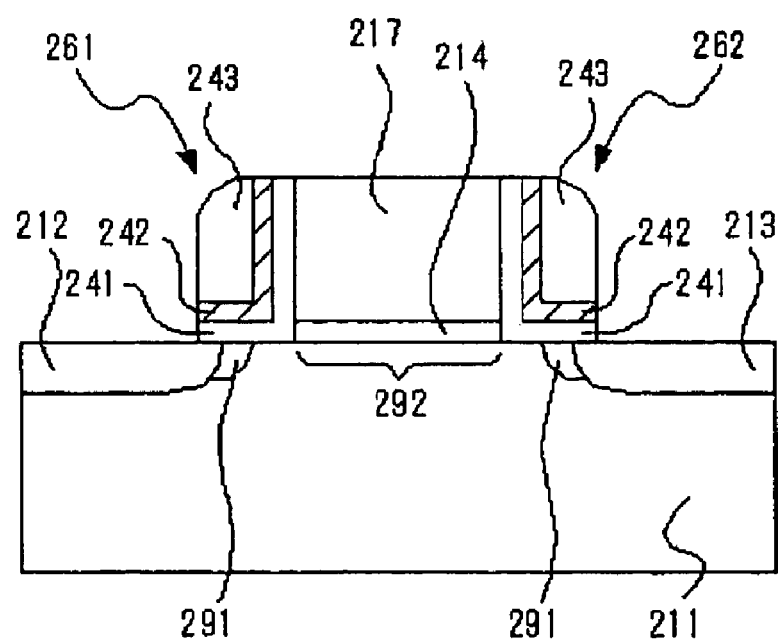
FIG. 16 is a schematic cross-sectional view of a major part of a memory element in a semiconductor memory device in accordance with embodiment 6 of the present invention.

As shown in FIG. 16, a memory element in a semiconductor storage device of the present embodiment has substantially the same arrangement as that of the memory element in Embodiment 2, except for the arrangement in which P-type high concentration regions 291 are additionally provided adjacent to ends of N-type diffusion regions 212 and 213 facing a channel region. More specifically, concentration of impurity giving a P-type nature (for example, boron) to the P-type high concentration regions 291 is higher than that of impurity giving a P-type nature to a region 292. Suitable P-type impurity concentration in the P-type high concentration regions 291 is, for example, in the order of $5\times10^{17}$ cm to $1\times10^{19}$ cm$^{-3}$. Also, P-type impurity concentration in the region 292 can be, for example, $5\times10^{16}$ cm to $1\times10^{18}$ cm$^{-3}$.

Thus, provision of the P-type high concentration regions 291 causes a sharp junction of the diffusion regions 212 and 213 and a semiconductor substrate 211 directly beneath the memory functioning members 261 and 262. Therefore, hot carriers are more likely to generate during writing and erasing operations, allowing for decrease in voltage for writing and erasing operations or speedups of writing and erasing operations. Further, a relatively low impurity concentration in the region 292 causes a low threshold value when memory is in a state of being erased, thus increasing the amount of drain current. This increases a read-out speed. Therefore, it is possible to obtain a memory element with a low rewriting voltage or a high rewriting speed, and a high read-out speed.

In FIG. 16, provision of the P-type high concentration regions 291 beneath the memory functioning members (that is, not directly beneath the gate electrode) in the vicinity of a source region and a drain region remarkably increases a threshold value of the entire transistor. An extent of this increase is remarkably larger than that in the case where there are the P-type high concentration regions 291 directly beneath the gate electrode. When writing charges (electrons in a case where the transistor is N-channel type transistor) are accumulated in the memory functioning member, the difference between the threshold values become much larger. On the other hand, when enough erasing charges (positive holes in a case where the transistor is N-channel type transistor) are accumulated in the memory functioning member, a threshold value of the entire transistor drops to a threshold value determined depending on impurity concentration in the channel region (region 292) beneath the gate electrode. That is, a threshold value during erasing operation does not depend on impurity concentration in the P-type high concentration regions 291, whereas a threshold value during writing operation is significantly affected by impurity concentration in the P-type high concentration regions 291. Therefore, arrangement of the P-type high concentration regions 291 beneath the memory functioning members in the vicinity of the source region and drain region remarkably varies only a threshold value during writing operation, thus allowing for significant enhancement in memory effect (difference in threshold value between writing operation and erasing operation).

Embodiment 7

Figure 17:
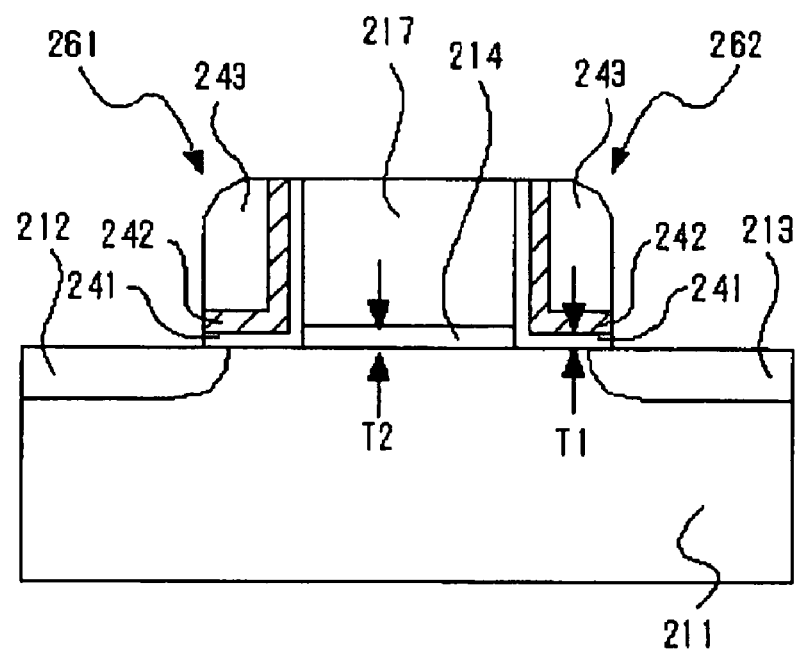
FIG. 17 is a schematic cross-sectional view of a major part of a memory element in a semiconductor memory device in accordance with embodiment 7 of the present invention.

As shown in FIG. 17, a memory element in a semiconductor storage deice of the present embodiment has substantially the same arrangement as that of the memory element in Embodiment 2, except for the arrangement in which a thickness (T1) of an insulating film isolating a charge holding film (silicon nitride film 242) from a channel region or well region is smaller than a thickness (T2) of a gate insulating film.

With the demand for the property of withstanding voltage during writing operation of memory, the gate insulating film 214 has a lower limit of the thickness T2. However, the thickness T1 of the insulating film can be smaller than the thickness T2, regardless of the demand for the property of withstanding voltage.

In this memory element, as described above, a high degree of flexibility in the thickness T1 results from the following grounds.

That is, in this memory element, the insulating film isolating a charge holding film from the channel region or the well region is not sandwiched between the gate electrode and the channel region or well region. Therefore, the insulating film isolating the charge holding film from the channel region or well region is not directly effected not by a high electric field between the gate electrode and the channel region or the well region, but is effected by a relatively weak electric filed extending from the gate electrode in the lateral direction. Therefore, regardless of the demand for the property of withstanding voltage with respect to the gate insulating film, the thickness T1 can be smaller than the thickness T2.

Reduction of the thickness T1 facilitates injection of charges into the memory functioning members, thus allowing for decrease in voltage during writing and erasing operations or speedups of writing and erasing operations. Also, reduction of the thickness T1 increases the amount of charges induced in the channel region or well region when charges are accumulated in the silicon nitride film 242, thus allowing for enhancement in memory effect.

By the way, among electric flux lines in the memory functioning members, there is a short one, as indicated by an arrow 284 in FIG. 13, that does not pass through the silicon nitride film 242. An electric field intensity on such a short electric flux line is relatively high, so that an electric field along this electric flux line plays a large role in writing operation. Reduction of the thickness T1 causes the silicon nitride film 242 to move downward in the drawing, so that the electric flux line indicated by the arrow 283 can pass through the silicon nitride film. This causes a high effective relative permittivity in the memory functioning member along the electric flux line 284, thus allowing for a smaller difference in potential between both ends of the electric flux line. Therefore, a large part of voltage applied to the gate electrode 217 is used to strengthen an electric field in the offset region, thus permitting speedups of writing and erasing operations.

On the contrary, in EEPROM typified by a flash memory, for example, an insulating film isolating a floating gate from a channel region or well region is sandwiched between a gate electrode (control gate) and the channel region or well region, so that the insulating film is directly effected by a high electric field from the gate electrode. Therefore, in the EEPROM, a thickness of the insulating film isolating the floating gate from the channel region or well region is limited, which inhibits the optimization for the functions of the memory element.

As is obvious from the above description, the relation T1<T2 allows for decrease in voltage during writing and erasing operations or speedups of writing and erasing operations, without decrease in voltage resisting performance of memory and further allows for enhancement in memory effect.

Note that, it is more preferable that the thickness T1 of the insulating film is 0.8 nm or more at which uniformity and film quality of the insulating film in manufacturing process can be maintained to a certain level, and which is a limit at which holding property does not degrade to an extreme.

Specifically, for a liquid crystal driver LSI with a large design rule which requires a high withstand voltage, a maximum voltage 15V to 18V is required to drive a liquid crystal panel TFT. Because of this, it is usually impossible to reduce the thickness of a gate oxide film. When a nonvolatile memory of the present embodiment for image control-use is mixed into the liquid crystal driver LSI, in the memory element of the present invention, it is possible to design a suitable thickness of the insulating film insulating a charge holding film (silicon nitride film 242) from the channel region or well region, independently from the thickness of the gate insulating film. For a memory cell with a gate electrode length (word line width) of 250 nm, for example, T1=20 nm and T2=10 nm can be set individually, thus realizing a memory cell of an excellent efficiency of writing. (The reason why no short channel effect occurs with the thickness T1 that is larger than that of an ordinary logic transistor is that a source region and a drain region are offset from the gate electrode.)

Embodiment 8

Figure 18:
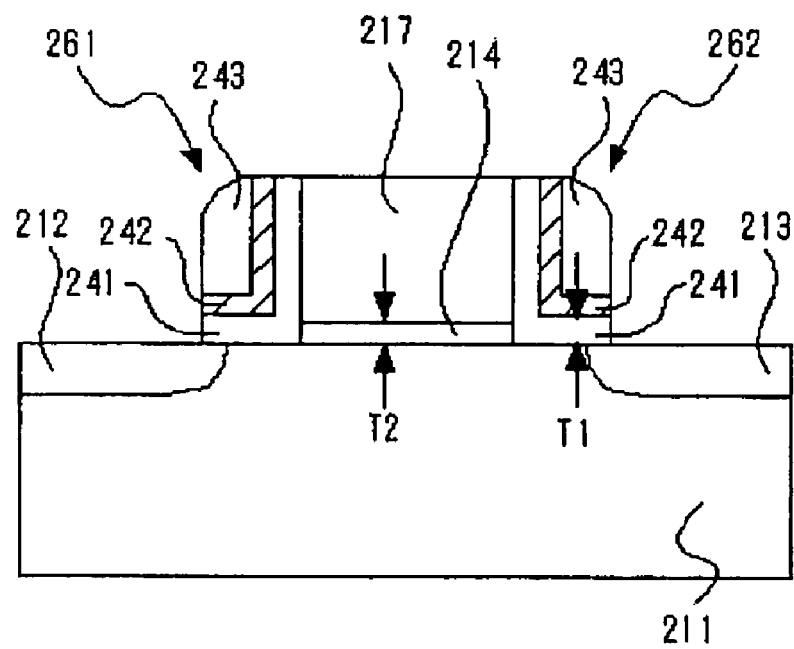
FIG. 18 is a schematic cross-sectional view of a major part of a memory element in a semiconductor memory device in accordance with embodiment 8 of the present invention.

As shown in FIG. 18, a memory element in a semiconductor storage device of the present embodiment has substantially the same arrangement as that of the memory element in Embodiment 2, except for the arrangement in which a thickness (T1) of an insulating film isolating a charge holding film (silicon nitride film 242) from a channel region or well region is larger than a thickness (T2) of a gate insulating film.

For a requirement for the prevention of short channel effect of a device, a gate insulating film 214 has an upper limit of its thickness T2. However, the thickness T1 of the insulating film can be larger than the thickness T2, regardless of the requirement for the prevention of short channel effect. That is, for the development of scaling down (the development of reduction in thickness of the gate insulating film), a thickness of an insulating film isolating the charge holding film (silicon nitride film 242) from the channel region or well region can be designed suitably, independently from a thickness of the gate insulating film. This brings about the effect that the memory functioning members do not get in the way of scaling down.

In the memory element of the present embodiment, the reason for a high degree of flexibility in the thickness T1 is, as described above, that the insulating film isolating the charge holding film from the channel region or well region is not sandwiched between the gate electrode and the channel region or well region. Therefore, the thickness T1 can be larger than the thickness T2, regardless of the requirement for the prevention of short channel effect with respect to the gate insulating film. Increase in thickness T1 enables the prevention of charges accumulated in the memory functioning members from scattering and improvement of holding property of memory.

Consequently, the relation T1>T2 enables improvement in holding property without degradation of short channel effect of memory.

Note that, the thickness T1 of the insulating film is preferably 20 nm or less, considering a decrease in rewriting speed.

More specifically, in a conventional nonvolatile memory typified by flash memory, a selection gate electrode constitutes a writing/erasing gate electrode, and a gate insulating film (including a floating gate) corresponding to the write-erasing gate electrode also serves as charge accumulating film. Therefore, the demand for a finer memory element (a thinner film is essential for the prevention of short channel effect) and the demand for securement of reliability (For prevention of leakage of holding charges, the thickness of an insulating film isolating the floating gate from the channel region or the well region cannot be reduced to about 7 nm or less.) are mutually contradictory, and hence, it is difficult to realize a finer memory element. Actually, according to ITRS (International Technology Roadmap for Semiconductors), a thinner physical gate length of about 0.2 micrometer or thinner is not yet in sight. However, in the memory element of the present embodiment, as described above, T1 and T2 can be designed individually, thus realizing a fine film structure.

For example, for a memory cell with a gate electrode length (word line width) of 45 nm, it is possible to realize a memory element which causes no short channel effect by individually setting the memory cell to T2=4 nm and T1=7 nm. The reason why no short channel effect occurs even when T2 is set thicker than a thickness of an ordinary logic transistor is because the source region and the drain region are offset with respect to the gate electrode. Further, in the memory element of the present embodiment, the source region and the drain are offset with respect to the gate electrode, thus further facilitating a finer memory element, as compared to an ordinary logic transistor.

That is, since an electrode for assisting writing and erasing does not exist in an upper part of the memory functioning member, a high electric field acting between the electrode for assisting writing and erasing and the channel region or well region does not directly act on the insulating film isolating the charge holding film from the channel region or the well region, but only a relatively low electric field which spreads in the horizontal direction from the gate electrode acts. Therefore, it is possible to realize a memory element holding a gate length as thin as or thinner than a gate length of a logic transistor in the same fabrication generation.

Embodiment 9

A present embodiment relates to a change in electric properties, the change being caused when a memory element is rewritten in a semiconductor storage device.

Figure 19:
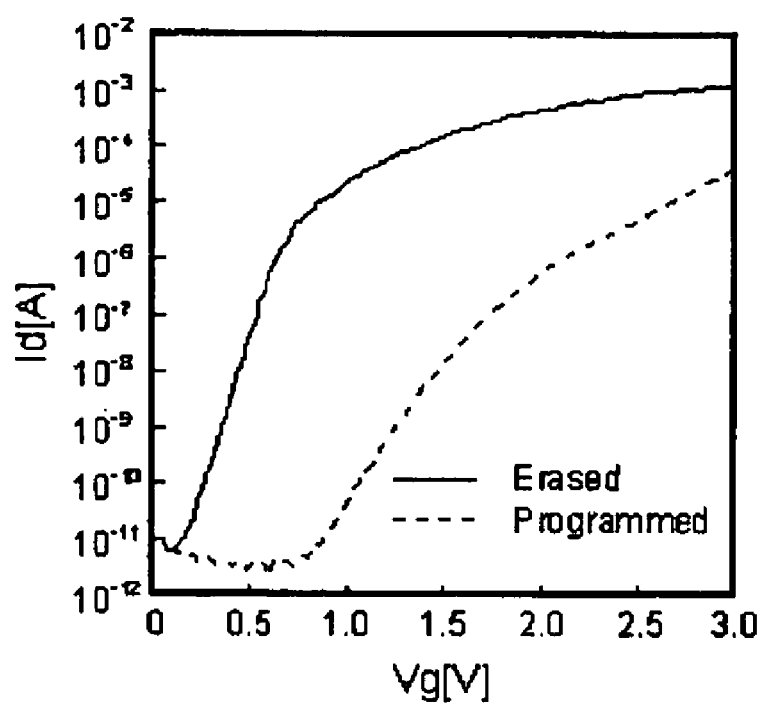
FIG. 19 is a graph illustrating an electric property of a memory element in the semiconductor memory device in accordance with embodiment 9 of the present invention.

In an N-channel type memory element, a change in an amount of charge in a memory functioning member results in drain current (Id)-gate voltage (Vg) characteristics (measured values), as shown in FIG. 19.

Figure 31:
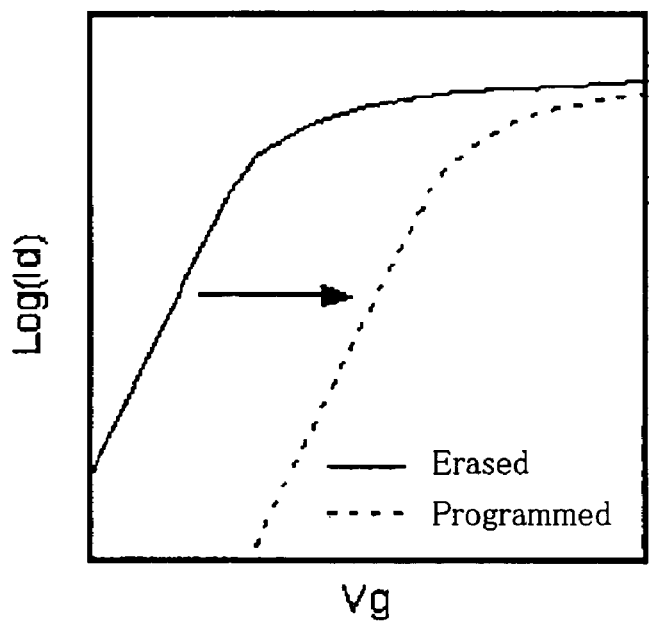
FIG. 31 is a graph showing an electric property of a conventional flash memory.

As shown in FIG. 19, a writing operation starting from erased state (solid line) not only increases a threshold value, but also significantly decreases the gradient of the graph in a sub-threshold region. Therefore, even in a region in which the gate voltage (Vg) is relatively high, a drain current ratio between an erasing state and a writing state is large. For example, where Vg=2.5V, the current ratio is in two digits or more. This characteristic is significantly different from that of the flash memory (see FIG. 31).

The appearance of this characteristic is a unique phenomenon caused because an offset between a gate electrode and a diffusion region makes it difficult for a gate electric field to enter an offset region. When the memory element is in the writing state, it is very difficult to generate an inversion layer in the offset region under the memory functioning member, even if a positive voltage is applied on the gate electrode. This is the reason why the gradient of the Id-Vg curve is small in the sub-threshold region when the memory element is in the writing state.

On the other hand, when the memory element is in the erasing state, electrons are induced in high density in the offset region. Further, when a voltage of 0V is applied on the gate electrode (that is, when the memory element is in an off state), no induction of electrons is caused in a channel under the gate electrode (therefore, an off current is small). This is the reason why the Id-Vg curve has a large gradient in the sub-threshold region and an increasing rate (conductance) of current is large in the regions at or above the threshold value, when the memory element is in the erasing state.

As described above, the memory element constituting the semiconductor storage device of the present embodiment is capable of attaining an especially large drain current ratio between in writing and in erasing.

Embodiment 10

The present embodiment relates to semiconductor memory devices containing those memory elements described in embodiments 1 to 8 and also to a page buffer circuit used in the semiconductor memory devices.

In the following, "rewrite" refers to an operation involving at least either writing or erasing.

Figure 20:
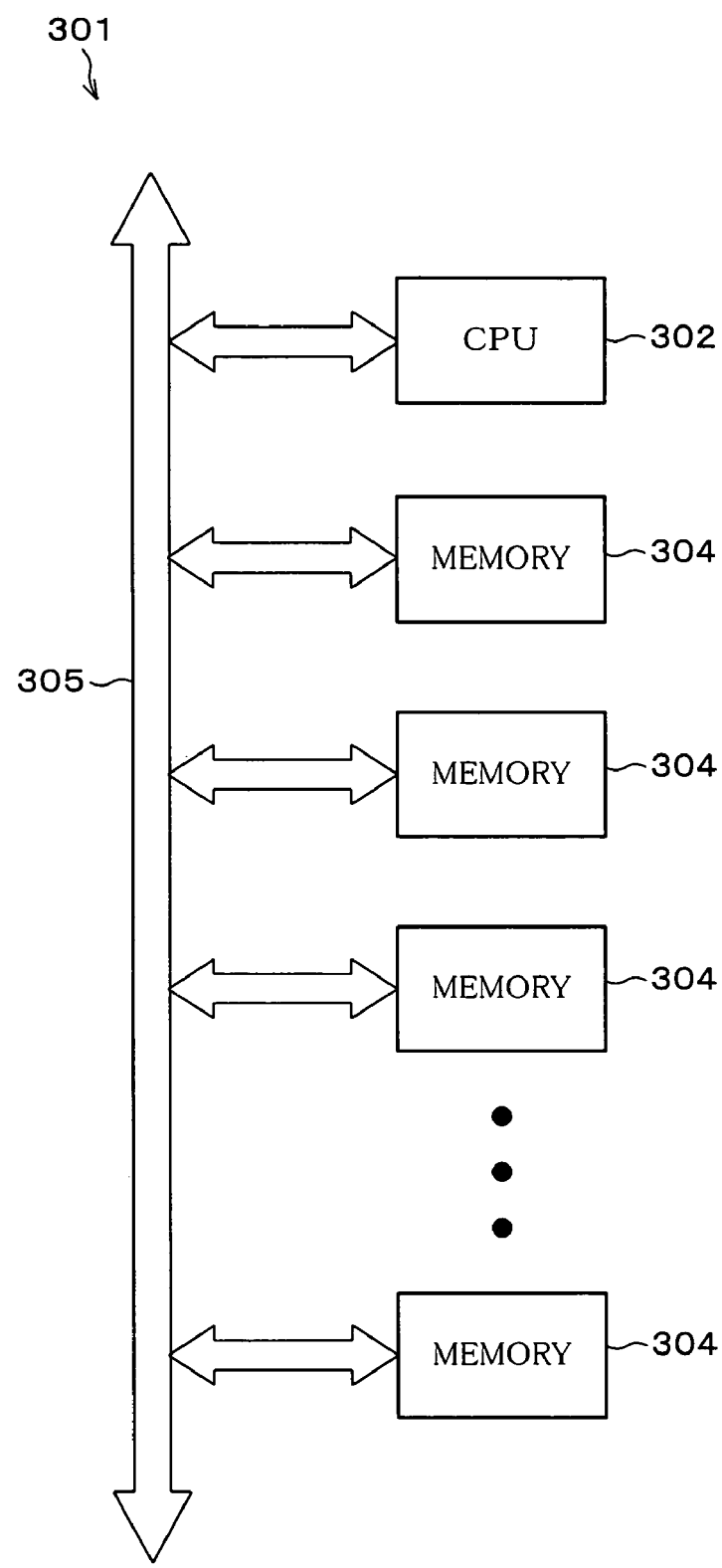
FIG. 20 is a block diagram showing a computer system (embodiment 10) in accordance with the present invention having the semiconductor memory devices of embodiments 1 to 8 as memories.

FIG. 20 shows a computer system 301 in accordance with the present embodiment.

The computer system 301 includes a central processing unit (CPU) 302, a main memory 303, and a set of memories 304.

The CPU 302 communicates with the main memories 303 and 304 over a main bus 305. The CPU 302 reads the contents of the memories 304 by generating a memory read cycle over the main bus 305. The CPU 302 also rewrites the memories 304 by transferring rewrite commands and rewrite data blocks to the memories 304 over the main bus 305.

Each memory 304 is arranged from semiconductor memory devices detailed above. The memory 304 provides a non-volatile random-access large scale data storage for the computer system 301.

Figure 21:
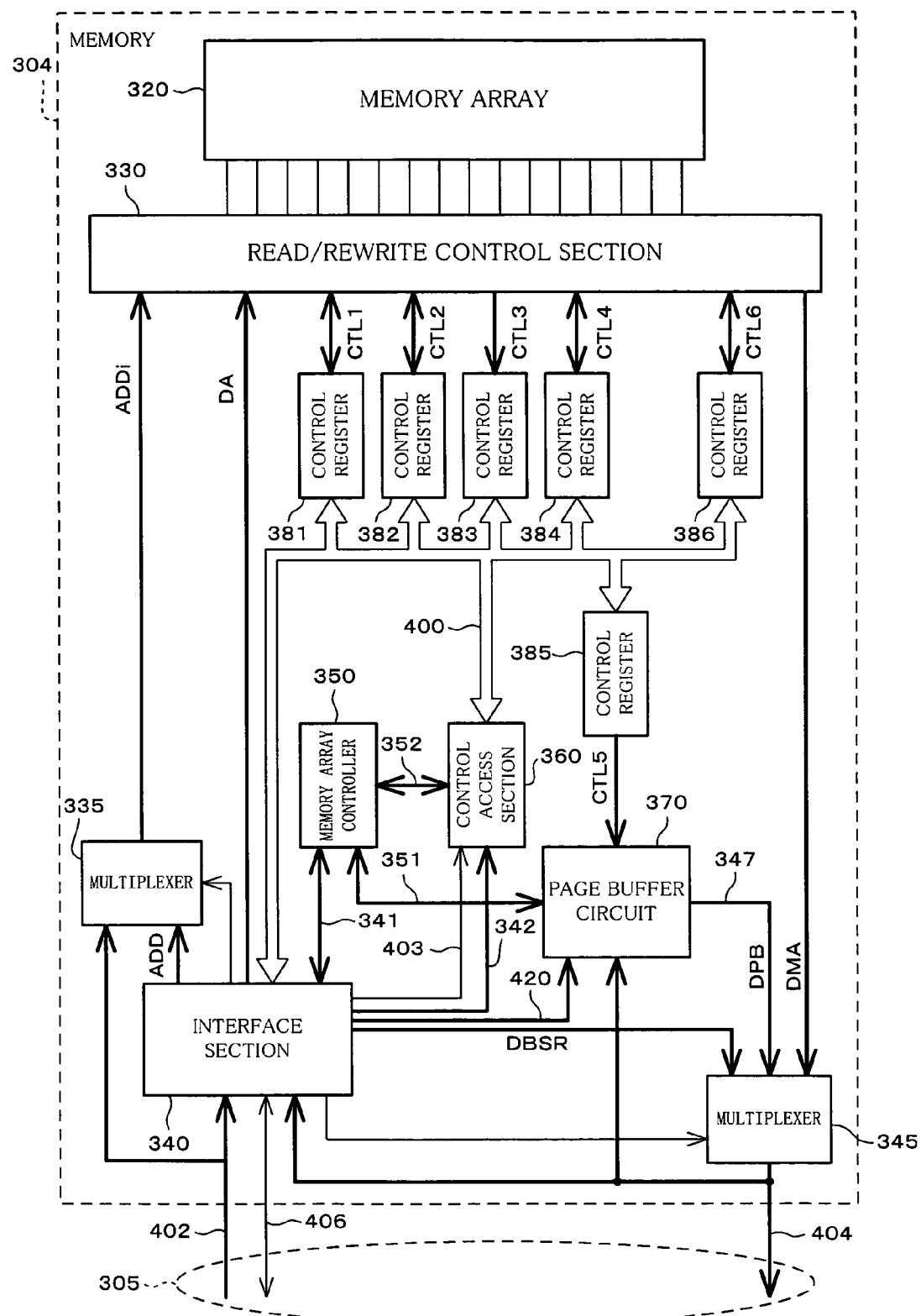
FIG. 21 is a block diagram showing a structure of a memory in the computer system in FIG. 20.

FIG. 21 shows the structure of the memory 304.

Referring to FIG. 21, the memory 304 includes a memory array 320, an interface section 340, a memory array controller 350, a set of page buffer circuits 370, a set of control register sections 381 to 386, and a set of read/rewrite control sections 330.

For example, the memory array 320 is structured so that 32 memory array blocks forms a single set. Each memory array block provides 64 kilobytes of data storage. The main bus 305 includes a user address bus 402, a user data bus 404, and a user control bus 406.

The read/rewrite control section 330 includes circuitry forming a read/rewrite access path to the memory array 320. For example, the read/rewrite control section 330 includes a row/column address decoder for the memory array 320, a redundancy circuit, a mini array circuit, and a path detection circuit. The redundancy circuit overrides addresses if defective memory cells are detected in the memory array 320. The mini array circuit generates reference memory bits. The path detection circuit compares reference memory bits to bits from the memory array 320 to determine whether the bits are logical 1s or 0s.

The read/rewrite control section 330 also includes a multiplexer to enable 8-bit and 16-bit access. The multiplexer compares bits from the memory array 320 to redundant bits, similarly to a multiplexer circuit selecting between the high and low bytes of the memory array 320. The read/rewrite control section 330 includes an output buffer circuit for dividing data outputs from the memory array 320 at output terminals of the memories 304.

The read/rewrite control section 330 has an address transition detection circuit which generates control pulses when address transitions are detected. The control pulses are used to speed column charging at the outputs of the memory array 320 before data is in standby.

The read/rewrite control section 330 includes a high voltage circuit for accessing the memory array 320. For example, the read/rewrite control section 330 includes a VPX switching circuit setting the word line voltage for programming data in the memory array 320 and a VPY generating circuit setting the programming load line. The read/rewrite control section 330 also includes VSI generating circuit for setting the source voltage for unselected blocks in the memory array 320 during programming.

The read/rewrite control section 330 includes a D/A converter circuit generating a reference voltage level for program verify, erase verify, and post erase repair operations. The read/rewrite control section 330 includes a VPS switch circuit setting the source voltage level to Vpp during an erase operation.

The control registers 381 to 386 include dedicated control registers and associated circuits controlling the read/rewrite control section 330. The dedicated control register is programmed and accessed over a central control bus 400.

The interface section 340 enables access to the memory array 320 by processing incoming commands over the main bus 305. The interface section 340 also checks incoming commands over the user data bus 404 and forms a string of commands over a queue bus 341 for transmission to the memory array controller. The memory array controller 350 executes commands using suitable parts of the memories 304.

The memory array controller 350 is a special reduced-instruction-set processor to perform write operations on the memory array 320. The memory array controller 350 includes an arithmetic logic unit, general-purpose registers, a control store, and a control sequencer. The memory array controller 350 receives commands over the queue bus 341 and sends the commands to a suitable location of the control store to execute the commands.

To access the control register circuits 381 to 386 over the central control bus 400, a control access section 360 enables the operation of both the interface section 340 and the memory array controller 350. The memory array controller 350 accesses the control registers 381 to 386 by controlling the control access section 360 over the central control bus 400 during the normal mode of the memories 304.

The memory array controller 350 writes to a special instruction register by transferring a write control signal over a bus 352 and rewrites a register address together with corresponding rewrite data in the control access section 360. The control access section 360 generates a rewrite cycle over the central control bus 400 to program an addressed special control register. The memory array controller 350 reads the special control register by transferring a register address and a read control signal, to control the control access section 360 over the bus 352. The control access section 360 also generates a read access cycle over the central control bus 400 to read the addressed special control register.

The control register section 381 includes a special control register and circuitry for controlling the high voltage circuit in the read/rewrite control section 330 in accordance with a control signal CTL1. The high voltage control registers include source switch interface registers, interface registers for controlling VPX and VPIX multiplexers, VPP/VCC switch interface registers, interface registers for controlling reference generators, multiplexers, comparators, and programming data path interface registers.

The control register section 382 includes control registers and specified column access registers for controlling a specified column access circuit of the read/rewrite control section 330 in accordance with a control signal CTL2. The specified column access control registers include mini array interface registers, redundancy interface registers, imprint interface registers, and area-addressable memory interface registers.

The control register section 383 includes read-only registers for detecting and latching a status signal CTL3 from the read/rewrite control section 330. The status signal CTL3 include TTL buffers corresponding to input terminals of the memories 304, outputs from sense amplifiers for the memory array 320, page buffer counter outputs, outputs from the comparator in the read/rewrite control section 330, and a memory array controller 350 program counter.

The control register 384 includes control registers and control circuitry for controlling the read path for the read/rewrite control section 330 in accordance with a control signal CTL4. The read path control registers include automatic transition detection interface registers, sensing interface registers, x, y, z path interface registers, and c path interface registers.

The control register 385 include registers controlling the test mode of the page buffer circuit 370. The control registers in the control register 384 generate a test mode control signal CTL5. The control registers in the control register 385 are programmed by the memory array controller 350 or the interface section 340 over the central control bus 400.

The control register 386 includes registers controlling specified test features of the memories 304 in accordance with the control signal CTL5. A specified test register includes test mode access registers, VPP capture registers, ready/busy modifier registers, and address allocating registers.

The interface section 340 controls a multiplexer 335 for selecting an input address ADDi to be fed to the read/rewrite control section 330. The multiplexer 335 selects either one of the address detected by a TLL buffer (not shown) in the user address bus 402 and the address ADD latched by the interface section 340 for output to the input address ADDi.

The interface section 340 controls a multiplexer 345 to select one of incoming data sets for output over the user data bus 404. The selected output data is either memory array data DMA from the read/rewrite control section 330, page buffer data DPB from the page buffer circuit 370, or block status register data DBSR from the interface section 340. The block status register data DBSR is output a set at a time from the block status registers 416 (see FIG. 22) in the interface section 340.

The CPU 302 reads data from the memory array 320 by transferring addresses to the user address bus 402 while outputting a read cycle to the user control bus 406. As the interface section 340 detects a read cycle, the multiplexer 335 passes the addresses from the user address bus 402 on to an x, y decoder in the read/rewrite control section 330, whereas the multiplexer 345 passes the addressed read data from the read/rewrite control section 330 on to the user data bus 404.

The CPU 302 rewrites data into the memory array 320 by generating a I/O rewrite cycle over the main bus 305, to transfer programming data blocks to the page buffer circuit 370. The interface section 340 checks rewrite commands and generates a string of rewrite commands for the memory array controller 350. The memory array controller 350 executes the rewrite commands by reading programming data from the page buffer 370 over the control bus 351 and programming an appropriate area of the memory array 320.

The memory array controller 350 contains an algorithm regulating the high voltage circuit in the read/rewrite control section 330 to charge memory elements in the memory array 320 and discharge the memory elements in the memory array 320. The memory array controller 350 also controls the high voltage circuit by means of the algorithm and accesses the control registers 381 to 386 over the central control bus 400 to address the memory array 320.

The read/rewrite control section 330 includes a source switch circuit for applying an appropriate voltage level to the memory array 320 for an erase function. The read/rewrite control section 330 also includes a program read circuit driving program level voltage on bit lines in the memory array 320 during programming.

Figure 22:
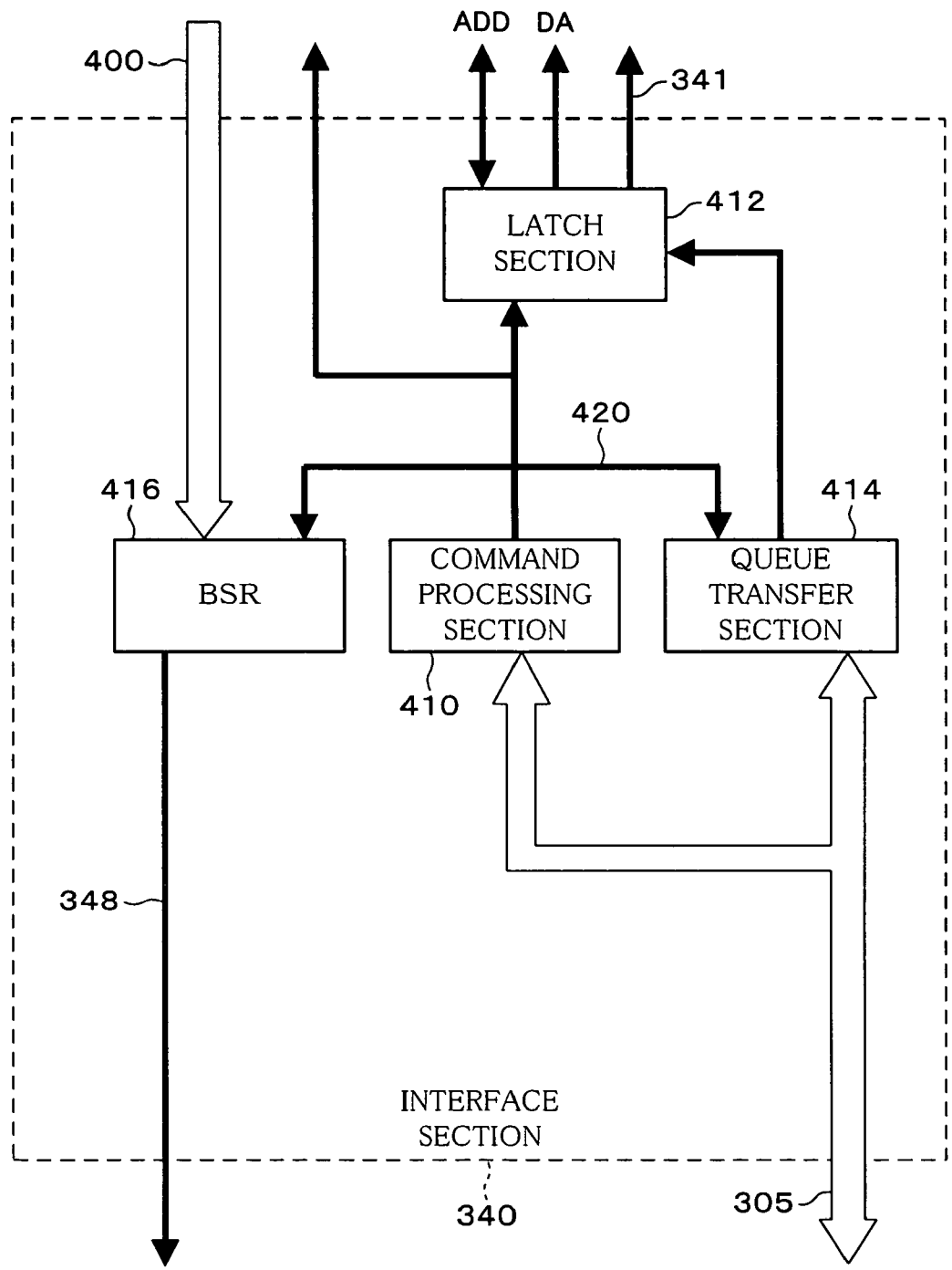
FIG. 22 is a block diagram showing a structure of an interface section in the memory in FIG. 20.

The interface section 340 has 32 block status registers 416 (see FIG. 22). Each block status register 416 corresponds to a block in the memory array 320. The memory array controller 350 maintains status bits in the block status registers 416 to indicate the block status of the memory array 320. The CPU 302 reads the contents of the block status registers over the main bus 305.

FIG. 22 illustrates the interface section 340.

Referring to FIG. 22, the interface section 340 includes a command processing section 410, a latch section 412, a queue transfer section 414, and a set of 32 block status registers (BSR) 416.

The command processing section 410 receives commands from the CPU 302 over the main bus 305. CPU 302 commands include commands to execute a program and erase operations on individual bytes or words of the memory array 320 and commands to execute a program and erase operations with the data stored in the page buffer circuit 370.

The command processing section 410 checks commands and transfers the commands and associated parameters to the memory array controller 350 over the queue transfer section 414. The command processing section 410 outputs a control signal over a command bus 420 to control operation mode of the page buffer circuit 370. The command processing section 410 processes commands to read status registers of the block status registers 416. The command processing section 410 selects the status registers of the block status registers 416 by outputting address and control signals to the command bus 420. The status registers of the block status registers 416 include a global status register indicating the status of the page buffer circuit 370.

The queue transfer section 414 transfers an address ADD latched by the latch section 412 to the multiplexer 335 and array data DA latched by the latch section 412 to the read/rewrite control section 330. The queue transfer section 414 also transfers checked command and associated parameters to the memory array controller 350 over the queue bus 341.

The block status registers 416 include block status registers, one for each memory array block of the memory array 320. Each block status register in the block status registers 416 provides a user with information identifying a block status.

The memory array controller 350 maintains status bits in the status registers of the block status registers 416. The memory array controller 350 accesses the status registers of the block status registers 416 over the central control bus 400 and reads and writes the block status registers 416.

The interface section 340 enables read access to the status registers over the main bus 305. The CPU 302 reads the status registers of the block status registers 416 by transmitting read status register commands to the command processing section 410 over the main bus 305. The read block status register commands include status register addresses to select the 32 block status registers in the block status registers 416.

The command processing section 410 transfers the status register address over the command bus 420 to select the status registers of the block status registers 416. The contents of the selected status registers (block status register data DBSR) outputs from the block status registers 416 to the multiplexer 345 over a BSR data bus 348. The multiplexer 345 outputs block status register data the user data bus 404.

Figure 23:
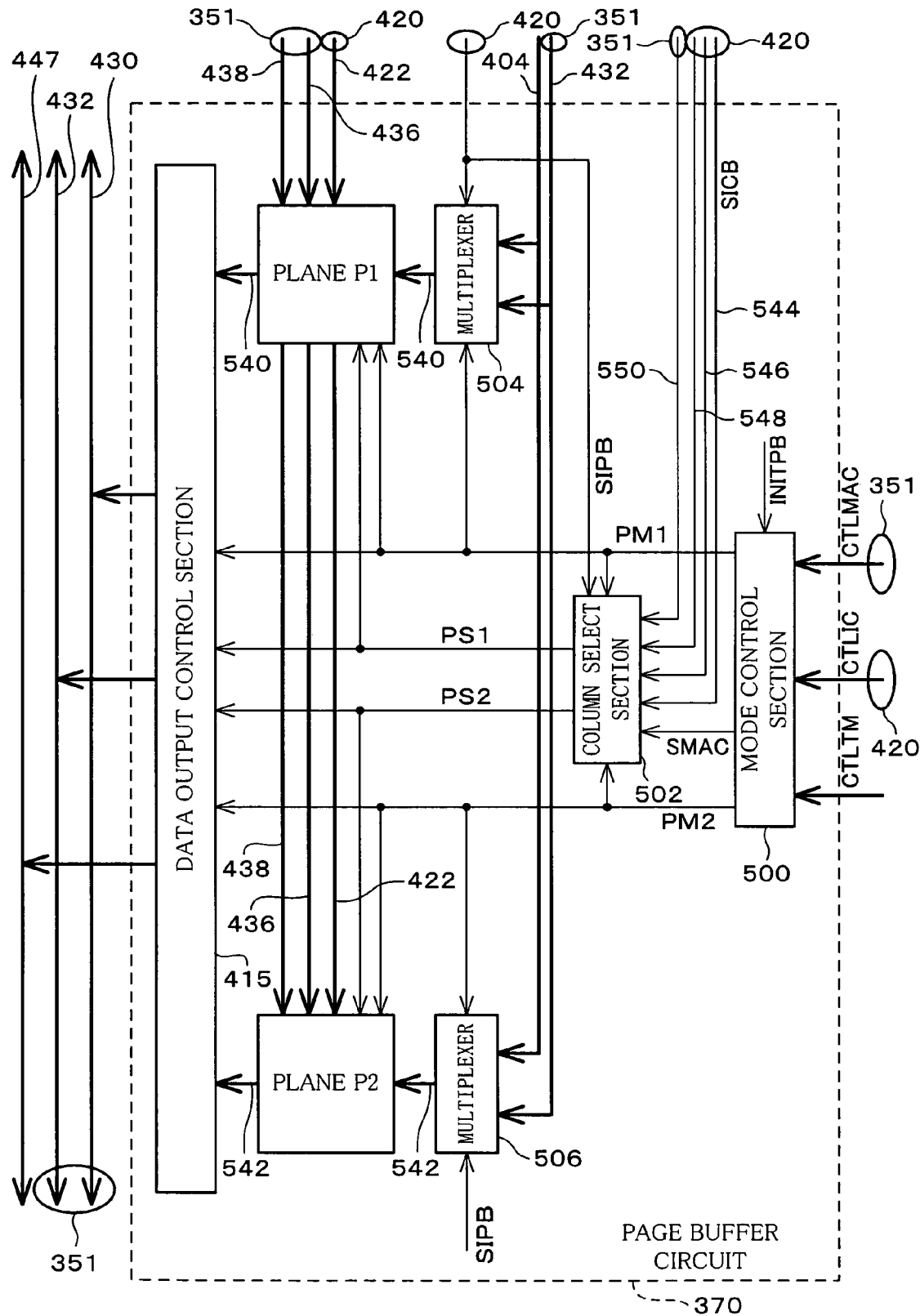
FIG. 23 is a block diagram showing a structure of a page buffer circuit in the memory in FIG. 20.
Figure 24:
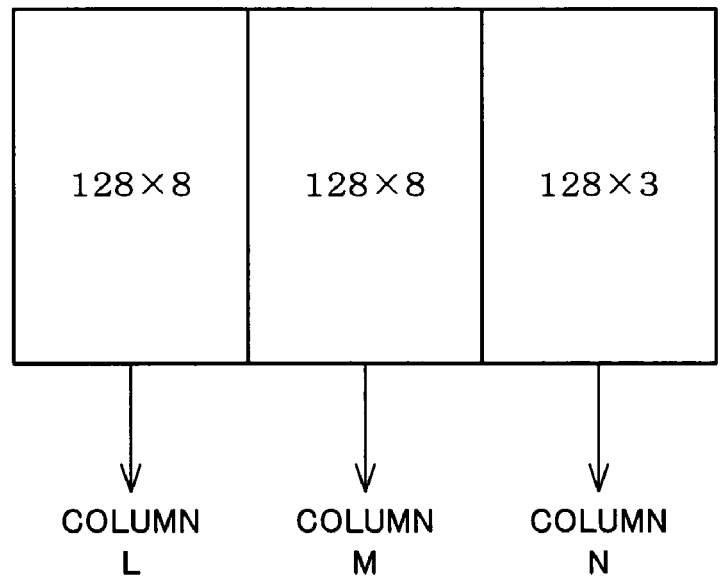
FIGS. 24(a) and 24(b) are drawings showing two planes formed by the page buffer circuit.
Figure 24:
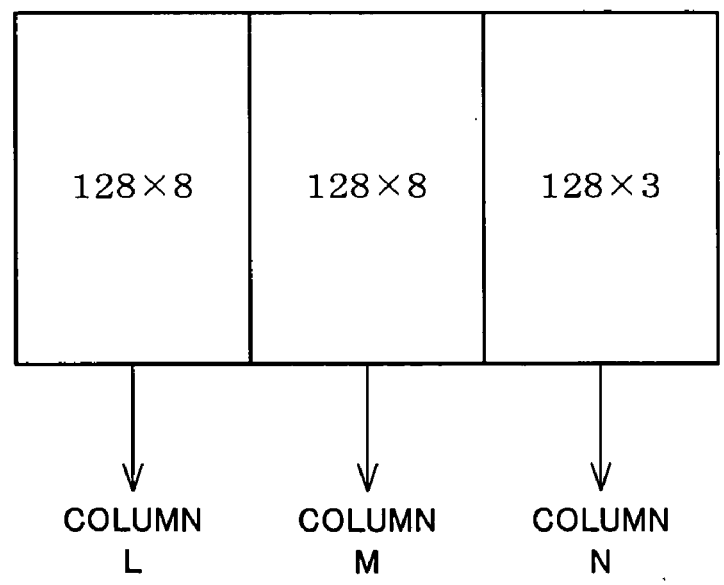
Figure 25:
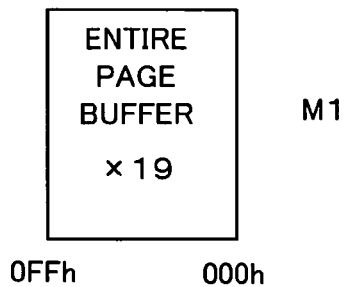
FIGS. 25(a) to 25(c) are drawings showing address mapping in the page buffer circuit.
Figure 25:
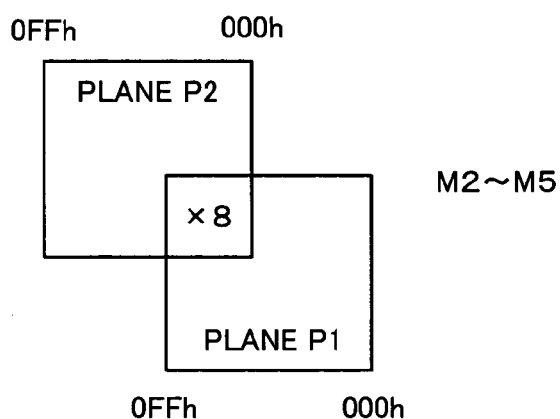
Figure 25:
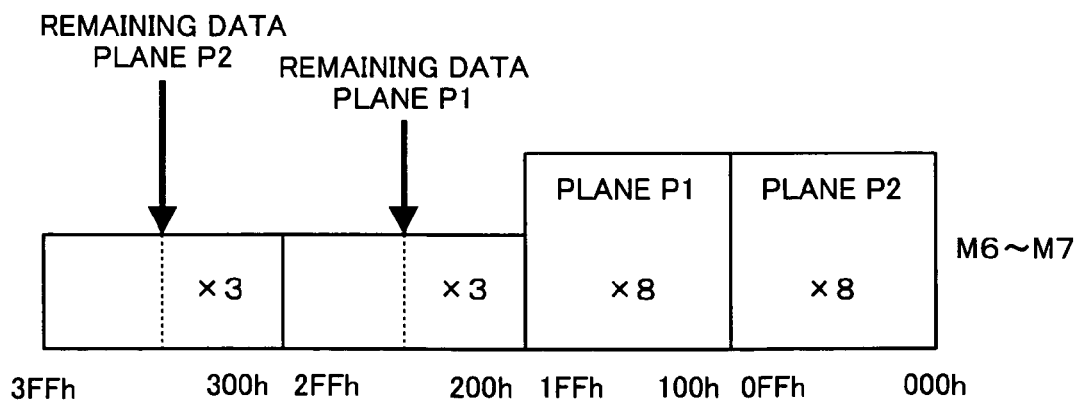

FIG. 23 illustrates the page buffer circuit 370.

As shown in FIG. 23, the page buffer circuit 370 has planes P1, P2 containing two separate 256×8 bit SRAMs (static random access memories).

The command bus 420 includes an interface address bus 422 to transmit an IC control signal CTLIC, an IC byte signal SICB, and an initial page buffer signal SIPB. The control bus 351 includes an MAC (memory array control) data bus 432, an MAC address bus 436, an MAC program counter bus 438, and an MAC instruction bus 430 to transmit an MAC control signal CTLMAC.

The rows on the planes P1, P2 are addressed by means of addresses fed over the IC address bus 422, the MAC address bus 436, and the MAC program counter bus 438. The command processing section 410 addresses the plane P1 and the plane P2 by means of IC addresses fed over the IC address bus 422. The memory array controller 350 addresses the plane P1 and the plane P2 during a data access over the MAC address bus 436. The memory array controller 350 addresses the plane P1 and the plane P2 during the obtaining of instructions on the MAC program counter bus 438.

The page buffer circuit 370 includes a mode control section 500, a column select section 502, a multiplexer 504, 506, and a data output control section 415.

The mode control section 500 generates the plane mode signal PM1 and the plane mode signal PM2 to determine the mode of the page buffer circuit 370. The plane mode signals PM1, PM2 are 3 bits each. The plane mode signal PM1 determines a mode for the plane P1, and the plane mode signal PM2 determines a mode for the plane P2. The mode control section 500 generates the plane mode signals PM1, PM2 in accordance with the MAC control signal CTLMAC from the memory array controller 350, the IC control signal CTLIC from the command processing section 410, and the test mode control signal CTLTM.

The MAC control signal CTLMAC contains bit 7 of the MAC program counter, bit 8 of the MAC address bus 436, and a current MAC instruction. The IC control signal CTLIC contains bit 8 of the IC address bus 422, an IC plane status signal, and an IC plane select signal. The IC control signal CTLIC includes a MAC plane signal, a MAC plane select signal, a single byte/word rewrite signal, and a rewrite continuous signal.

The test mode control signal CTLTM contains a MAC control store enable signal, a test mode extend signal, and a 2-bit MAC override signal. The MAC control store enable signal determines if the page buffer circuit 370 functions as a control store for the memory array controller 350. The test mode extend signal determines if the page buffer circuit 370 functions in extend modes EM 6, 7.

FIGS. 24(a), 24(b) illustrate the arrangement of the planes P1, P2.

As shown in FIGS. 24(a), 24(b), each of the planes P1, P2 is made up of two 128×8 bit columns (columns L, M) and one 128×3 bit column (column N). The columns L, M stores byte or word values. The column N stores remaining bits for a specified test mode of the page buffer circuit 370. Operation modes of the page buffer circuit 370 include modes M0 to M7.

In mode M0, access to the page buffer circuit 370 is invalid. The page buffer circuit 370 is not accessible to users, such as the CPU 302, and the memory array controller 350.

In mode M1, the page buffer circuit 370 functions as a control store for the memory array controller 350 in special test mode. The memory array controller 350 fetches instructions by transferring instruction addresses to the page buffer circuit 370 over the MAC address bus 436. The memory array controller 350 also fetches corresponding instructions from the page buffer circuit 370 over the MAC instruction bus 430.

In mode M2, the interface section 340 reads the page buffer circuit 370 in user mode and fetches a read page buffer command over the main bus 305. The read page buffer command identifies a read address for the page buffer circuit 370. The command processing section 410 transfers the read address to the page buffer circuit 370 over the IC address bus 422. The page buffer circuit 370 reads corresponding read data over the page buffer data bus 347. The interface section 340 controls the multiplexer 345 so that the multiplexer 345 outputs the read data over the user data bus 404.

In mode M3, the interface section 340 writes to the page buffer circuit 370 in user mode. A user mode write to the page buffer circuit 370 is either a rewrite byte/word process or a rewrite continuous process. The rewrite byte/word process to the page buffer circuit 370 starts when the interface section 340 has fetched a rewrite page buffer command over the main bus 305. The rewrite page buffer command identifies a write address and a rewrite data value for the page buffer circuit 370. The command processing section 410 transmits a rewrite address to the page buffer circuit 370 over the IC address bus 422. The page buffer circuit 370 obtains a rewrite data value over the user data bus 404.

The rewrite continuous process to the page buffer circuit 370 starts when the interface section 340 has fetched a rewrite page buffer continuous command over the main bus 305. The rewrite page buffer continuous command identifies the start address and byte count for the page buffer circuit 370. The interface section 340 includes a rewrite counter circuit (not shown). The rewrite counter circuit is read along with the byte count when the rewrite page buffer continuous command is fetched. Thereafter, the rewrite counter circuit decrements when the page buffer circuit 370 has fetched the rewrite data over the user data bus 404. In obtaining the rewrite data value, the command processing section 410 addresses the page buffer circuit 370 over the IC address bus 422 in accordance with the rewrite counter circuit.

In mode M4, the memory array controller 350 reads from the page buffer circuit 370 in user mode. For example, the memory array controller 350 reads programming data from the page buffer circuit 370 during programming with a page buffer operation. The memory array controller 350 addresses the page buffer circuit 370 over the MAC address bus 436. The memory array controller 350 obtain corresponding programming data from the page buffer circuit 370 over the MAC data bus 432.

In mode M5, the memory array controller 350 rewrites to the page buffer circuit 370 in user mode. The memory array controller 350 addresses the page buffer circuit 370 over the MAC address bus 436 and transfers corresponding rewrite data to the page buffer circuit 370 over the MAC data bus 432.

In mode M6, the interface section 340 reads the page buffer circuit 370 in special test mode having an extended space. The interface section 340 fetches a read page buffer command identifying a read address over the main bus 305. The command processing section 410 transfers the read address to the page buffer circuit 370 over the IC address bus 422. The page buffer circuit 370 then transfers a corresponding read data over the page buffer data bus 347.

In mode M7, the interface section 340 rewrites to the page buffer circuit 370 in special test mode having an extended space. The interface section 340 fetches a rewrite page buffer command identifying write address and a rewrite data value over the main bus 305. The command processing section 410 transfers the write address to the page buffer circuit 370 over the IC address bus 422. The page buffer circuit 370 obtains the rewrite data value over the user data bus 404.

FIGS. 25(a) to 25(c) illustrate address mapping of the page buffer circuit 370 in each mode.

As shown in FIG. 25(a), in mode M1, the entire page buffer making up the columns L, M, N in the plane P1 and the columns L, M, N in the plane P2 is mapped in a 256×19 bit control store. In mode M1, the page buffer circuit 370 functions as a 256 entry control store for the memory array controller 350.

As shown in FIG. 25(b), in modes M2 to M5, the page buffer circuit 370 is mapped to the two planes P1, P2, 256×8 bit each. The planes P1, P2 may be accessed by either the interface section 340 or the memory array controller 350 in 8-bit mode or 16-bit mode. In modes M2 to M5, the interface section 340 harmonizes access to the planes P1, P2 in accordance with the command fetched over the main bus 305. The interface section 340 ensures that neither the interface section 340 nor the memory array controller 350 accesses the same plane.

As shown in FIG. 25(c), in modes M6, M7, the planes P1, P2 are mapped to one adjacent extended memory space. The extended memory space includes the columns L, M, N of the plane P1 and the columns L, M, N of the plane P2. Modes M6, M7 contain special test mode to test the page buffer circuit 370.

Next, specific examples of an address bit field for accessing the page buffer circuit 370 will be described. The 10-bit address bits, A0 to A9, are transferred over the MAC address bus 436, the IC address bus 422, or the MAC program counter bus 438 in accordance with mode.

The address bit A9 functions as a remaining data select for selecting the plane P1 in mode M1 M6, M7 and the column N of the plane P1. The address bit A8 functions as a plane select for selecting either the plane P1 or the plane P2. The address bits A7 to A1 selects a row of the plane P1 and the plane P1. The address bit A0 selects either a high byte or a low byte of the row.

Now, specific examples of the assignment of the plane P1 and the plane P2 for access to the memory array controller 350 will be shown.

The MAC plane assignment is determined by a MAC plane select signal, a MAC plane status signal, and a MAC override signal.

If bits "0" and "1" of the MAC override signal are both zero, the MAC plane select signal determines whether the memory array controller 350 assigns the plane P1 or the plane P2. The MAC plane status signal indicates whether the plane determined by the MAC plane select signal is usable.

The MAC override signal overrides an ordinary plane assign mechanism and assigns either the plane P1 or the plane P2 to the memory array controller 350.

A specific example of assignment of the plane P1 and the plane P2 for access to the interface section 340 will be shown next. The plane assignment for the interface section 340 is determined by an IC plane status signal, an IC plane select signal, and a test mode extend signal.

When the test mode extend signal is active, the interface section 340 accesses the plane P1 and the plane P2 containing the remaining bits of the extended memory space. When the test mode extend signal is inactive, the IC plane select signal determines whether the interface section 340 has been assigned to either the plane P1 or the plane P2. The IC plane status signal indicates whether the plane selected by the IC plane select signal is usable.

The command processing section 410 generates the IC plane status signal, the IC plane select signal, the MAC plane status signal, and the MAC plane select signal to assign the plane P1 and the plane P2 to the memory array controller 350 and the interface section 340. The command processing section 410 generates the IC plane status signal, the MAC plane status signal, and the plane select signal to ensure that the plane P1 is not assigned simultaneously to both the memory array controller 350 and the interface section 340. Similarly, the command processing section 410 generates the IC plane status signal, the MAC plane status signal, and the plane select signal to ensure that the plane P2 is not assigned simultaneously to both the memory array controller 350 and the interface section 340.

The mode control section 500 generates a MAC byte signal SMAC. The MAC byte signal SMAC indicates whether the memory array controller 350 is performing byte or word access to the page buffer circuit 370. The mode control section 500 decodes current MAC instructions to determine the byte or word access.

The column select section 502 receives the plane mode signals PM1, PM2 and a MAC byte signal SMAC from the mode control section 500, and also receives an IC byte signal SICB. The IC byte signal SICB indicates whether a user executing byte or word access of the page buffer circuit 370. Byte or word access from a user is determined by a control input pin connected to the user control bus 406.

The column select section 502 shown in FIG. 23 over the signal line 546 receives bit "0" of the IC address bus 422 and bit "9" of the IC address bus 422 over the signal line 548. The column select section 502 receives bit "0" of the MAC address bus 436 over the signal line 550 and also with an initialize page buffer signal SIPB.

The column select section 502 generates a 3-bit plane select signal PS1 and a 3-bit plane select signal PS2. The plane select signal PS1 is a column select signal for selecting the plane P1. The plane select signal PS2 is a column select signal for selecting the plane P2.

The plane select signal PS2 is determined by the plane mode signal PM2, the MAC override signal, the initialize page buffer signal INITPB, the MAC address bit "0," the IC address bits "9" and "0," the MAC byte signal SMAC, and the IC byte signal SICB. The plane select signal PS1 is determined by the plane mode signal PM1, the MAC override signal, the initialize page buffer signal INITPB, the MAC address bit "0", the IC address bit "9", "0", the MAC byte signal SMAC, and the IC byte signal SICB. The plane P1 receives input data via the multiplexer 504. The multiplexer 504 receives data from the memory array controller 350 over the MAC data bus 432 and data from the user over the user data bus 404. The multiplexer 504 is controlled by the plane mode signal M1 and the initialize page buffer signal INITPB.

In modes M2, M3, M6, M7, the plane mode signal PM1 causes the multiplexer 504 to transfer input data from the user data bus 404 to the input of the plane P1. In modes M4, M5, the plane mode signal PM1 causes the multiplexer 504 to transfer input data from the MAC data bus 432 to the input of the plane P1.

The plane P2 receives input data via the multiplexer 506. The multiplexer 506 receives data from the memory array controller 350 over the MAC data bus 432 and also receives data from the user over the user data bus 404. The multiplexer 506 is controlled by the plane select signal PS2 and the initialize page buffer signal INITPB.

In modes M2, M3, M6, M7, the plane select signal PS2 causes the multiplexer 506 to transfer input data from the user data bus 404 to the input of the plane P2. In modes M4, M5, the plane mode signal PM2 causes the multiplexer 506 to transfer input data from the MAC data bus 432 to the input of the plane P2.

The plane P1 transfers output data over a first plane data bus 540. The first plane data bus 540 contains 19 bits of data, a high byte from the column L, a byte from the column M, and remaining 3 bits from the column N. Meanwhile, the plane P2 transfers output data over the second plane data bus 542. The second plane data bus 542 contains 19 of data including a high byte from the column L, a low byte from the column M, and remaining 3 bits from the column N.

Figure 26:
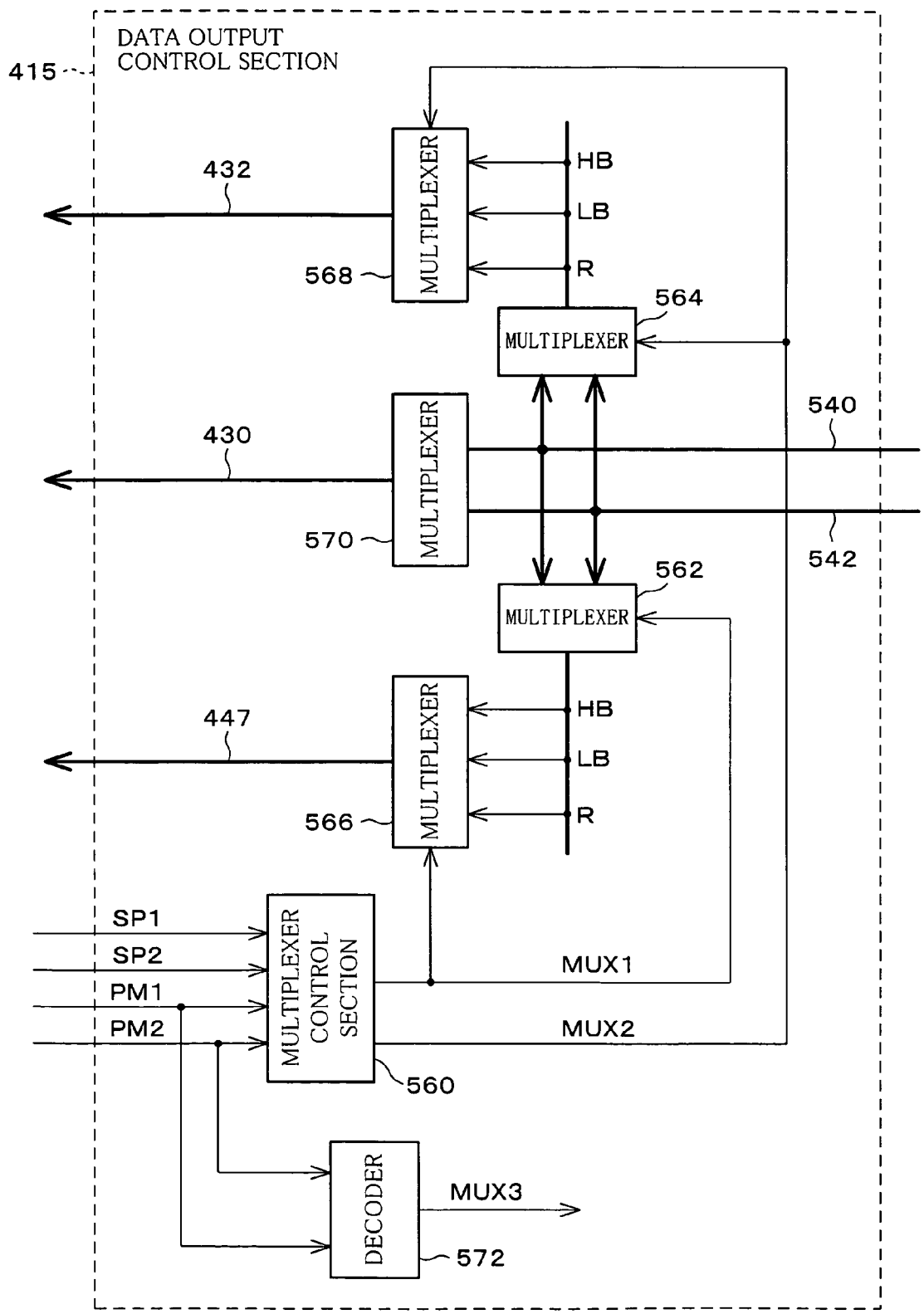
FIG. 26 is a block diagram showing a structure of a data output control section in the memory in FIG. 20.
Figure 27:
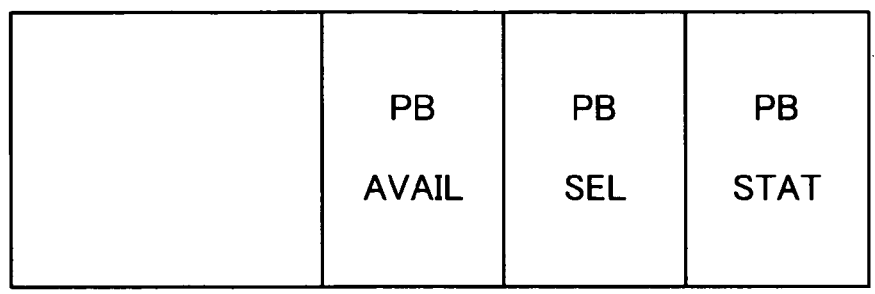
FIG. 27(a) is a drawing showing a global status register with a status bit indicating the status of the page buffer circuit.
FIG. 27(b) is a drawing showing a computer program sequence for a memory array operating the page buffer circuit.
Figure 27:
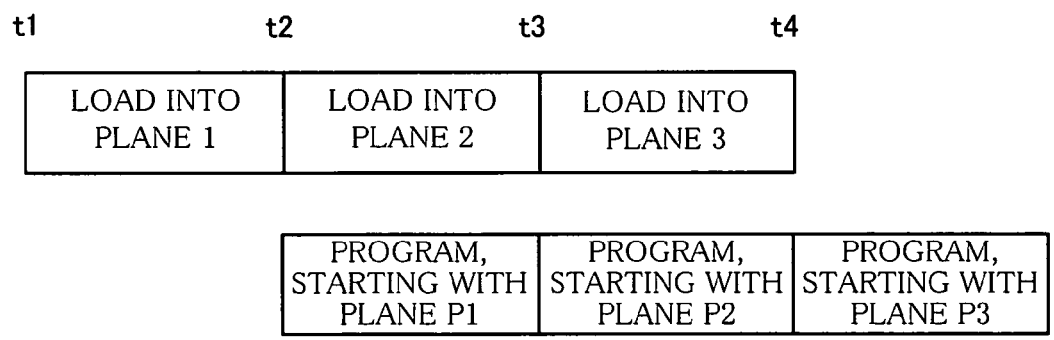

FIG. 26 illustrates the data output control section 415.

As shown in FIG. 26, the data output control section 415 includes a multiplexer control section 560 and a decoder 572, as well as multiplexers 562, 564, 566, 568, 570. The data output control section 415 transfers output data from the planes P1, P2 over the MAC data bus 432, the page buffer data bus 347, and the MAC instruction bus 430 in accordance with the plane mode signals PM1, PM2, the plane select signal PS1, and the plane select signal PS2. The data output control section 415 receives output data over the first plane data bus 540 and the second plane data bus 542.

The multiplexer control section 560 receives the plane select signals PS1, PS2 and the plane mode signals PM1, PM2, and based on these, generates a pair of multiplexer control signals MUX1, MUX2.

The decoder 572 receives the plane mode signals PM1, PM2, and based on these, generates a multiplexer control signal MUX3.

The multiplexer 562 selectively connects the first plane data bus 540 and the second plane data bus 543 to the input of the multiplexer 566. The first plane data bus 540 holds a high byte HB, a low byte LB, and a remaining bit R from the plane P1. The second plane data bus 542 holds a high byte HB, a low byte LB, and a remaining bit R from the plane P2. The multiplexer 562 selectively connects the first plane data bus 540 and the second plane data bus 542 to the multiplexer 566 through the control of the multiplexer control signal MUX1.

The multiplexer 566 selectively connects the input high byte HB, low byte LB, and remaining bit R to the page buffer data bus 447 through the control of the multiplexer control signal MUX1. For example, the page buffer data bus 447 contains 16 bits.

The multiplexer 564 selectively connects the first plane data bus 540 and the second plane data bus 543 to the input of the multiplexer 568. The multiplexer 564 selectively connects the first plane data bus 540 and the second plane data bus 542 to the multiplexer 568 through the control of the multiplexer control signal MUX2.

The multiplexer 568 selectively connects the input high byte HB, low byte LB, and remaining bit R to the MAC data bus 432 through the control of the multiplexer control signal MUX1. For example, the MAC data bus 432 contains 16 bits.

The multiplexer 570 receives output data from the plane P1 over the first plane data bus 540 and output data from the plane P2 over the second plane data bus 542. The multiplexer 570 selectively connects the first plane output data or the second plane output data to the MAC instruction bus 430 through the control of the multiplexer control signal MUX3. For example, the MAC instruction bus 430 is 19 including the high and low bytes from the remaining 3 bits from the columns L, M, N.

The data transferred over the page buffer data bus 347 is determined by the plane mode signals PM1, PM2 and the plane select signals PS1, SP2. The data MAC transferred over the data bus 432 is also determined by the plane mode signals PM1, PM2 and the plane select signals PS1, PS2. Meanwhile, the data transferred over the MAC instruction bus 430 is determined by the plane mode signals PM1, PM2.

FIG. 27(a) illustrates a global status register for the memories 304. FIG. 27(b) illustrates a program procedure for the memory array 320 operating the page buffer circuit 370.

As shown in FIG. 27(a), the global status register contains a status bit indicating the status of the page buffer circuit 370. The global status register is included in the interface section 340. A user reads the global status register over the main bus 305 to determine the status of the planes P1, P2 during modes M2 to M5. The global status register stores a page buffer available bit PBAVAIL, a page buffer select bit PBSEL, and a page buffer status bit PBSTAT.

The page buffer available bit PBAVAIL indicates whether either one of the page buffer plane (plane P1 or plane P2) is available for user access. The page buffer plane is available for user access when one of the page buffer planes is not assigned to the memory array controller 350.

The page buffer select bit PBSEL indicates which of the page buffer plane (plane P1 or plane P2) will be assigned for user access.

The page buffer status bit PBSTAT indicates whether the page buffer plane indicated by the page buffer select bit PBSEL is available for user access.

As shown in FIG. 27(a), at time t1, the user reads the global status register to determine if a page buffer plane is available for user access. In this example, the global status register is indicating that a page buffer plane is available for user access.

Thereafter, the user transfers program data to the assign plane P1 by transferring a rewrite continuous command which follows a rewrite data block over the user data bus 305. The page buffer circuit 370 automatically determines the rewrite data block to be the plane P1 as in the following.

At time t2, the user issues a program as well as a page buffer command to the memories 304. The command processing section 410 then receives the program along with the page buffer command, causes the program along with the page buffer command to standby for the memory array controller 350, and generates an IC control signal CTLIC to assign the plane P1 to the memory array controller 350 and assign the plane P2 for user access. Thereafter, the memory array controller 350 programs the memory array 320 with data from the plane P1.

Between times t2, t3, the user reads the plane P2 while the memory array controller 350 is programming from the plane P1. The user transfers the program data to the assigned plane P2 by transferring a rewrite continuous command which follows a rewrite data block over the user data bus 305. The page buffer circuit 370 automatically determines the rewrite data block to be the plane P2.

At time t3, the user issues a program along with a page buffer command to the memories 304. The command processing section 410 then receives the program along with the page buffer command, causes the program along with the page buffer command to standby for the memory array controller 350, and after the memory array controller 350 completes the program processing from the plane P1, generates an IC control signal CTLIC to assign the plane P2 to the memory array controller 350 and assign the plane P1 to the user access. Thereafter, while the user is reading the plane P1 along with the new program data block, the memory array controller 350 programs the memory array 320 with data from the plane P2.

The assignment of the page buffer planes P1, P2 may be switched by the user issuing a swap page buffer command. The command processing section 410 switches the assignment of the planes P1, P2 between the memory array controller 350 and the user access in response to the swap page buffer command.

As mentioned earlier, in the present embodiment, by sharing the planes P1, P2 in the page buffer circuit 370 between the user (for example, CPU 302) and the memory array controller 350 for the memories 304, the programming throughput for the memories 304 is improved. In addition, a multipage plane page buffer for the memories 304 is provided. Further, when the plane is in user mode, the user can readily access the plane. When the page plane is in memory control mode, the memory array controller 350 can readily access the plane.

Besides, by the interface section 340 switching the user mode and the memory control mode between the plane P1 and the plane P2, the assignment of the page planes to the user mode and the memory control mode is harmonized. Therefore, the memory array 320 can be programmed with data from one of the planes, while the memory control circuit is writing data to the other page plane.

The present embodiment, although describing the invention by means of specific examples, does not limit the present invention to the embodiment.

As in the foregoing, a semiconductor memory device in accordance with the present embodiment includes:

a memory array of memory elements each including: a gate electrode provided on a semiconductor layer with an intervening gate insulating film; a channel region provided beneath the gate electrode; a diffusion area provided on both sides of the channel region, having an opposite polarity to the channel region; and a memory functioning member provided on both sides of the gate electrode, having a function of storing electric charge;

a memory control circuit for programming the memory array;

a page buffer circuit including page planes providing a common resource shared between the memory control circuit and a user; and an interface circuit processing commands over a main bus, wherein the interface circuit performs mode control enabling the memory control circuit in user mode and memory control mode to access a page plane.

Thus, by sharing a page buffer resource between a user and a semiconductor memory device, programming throughput for the semiconductor memory device is improved. In addition, a multipage plane page buffer for the semiconductor memory device is provided. Further, when a page plane is in user mode, the user can readily access the page plane; when a page plane is in memory control mode, the memory control circuit can readily access the page plane.

By swapping the user mode and the memory control mode between the first page plane and the second page plane, the interface circuit harmonizes the assignment of the user mode and the memory control mode between the page planes; the memory array can be programmed with data from one of the page planes, while the memory control circuit is writing data to the other page plane.

In addition, the use of the memory element in place of conventional flash memories produces the following effects.

The memory functioning member in the memory element will have an improved rewrite rate due to the inclusion of an electric charge store film extending substantially parallel to a side of the gate electrode. The rewrite rate further will improve due to the provision of a p-type high concentration area adjacent to the channel side of an N-type diffusion area in the memory element. Further, the memory element has an insulating film separating the channel region or semiconductor layer from the film having a surface substantially parallel to a surface of the gate insulating film to store electric charge; since the insulating film is 0.8 nm thick or less, thinner than the gate insulating film, the memory functioning member is readily injected with electric charge, and the rewrite rate improves.

In this manner, the memory element has a faster programming speed than conventional ones. It therefore takes less time to complete programming the memory element than the flash memory described in the prior art section.

The memory element includes: a gate electrode provided on a semiconductor layer with an intervening gate insulating film; a channel region provided beneath the gate electrode; a diffusion area provided on both sides of the channel region; and a memory functioning member provided on both sides of the gate electrode, having a function of storing electric charge. Thus, the fabrication process of the memory element is highly compatible with that of ordinary transistors. This dramatically reduces mask and process step counts when compared to those cases where conventional flash memories as non-volatile memory element are implemented along with peripheral circuits made up of ordinary transistors (including circuits carrying out the techniques of the present invention). Chip yields improve and cost is reduced.

Embodiment 11

Figure 28:
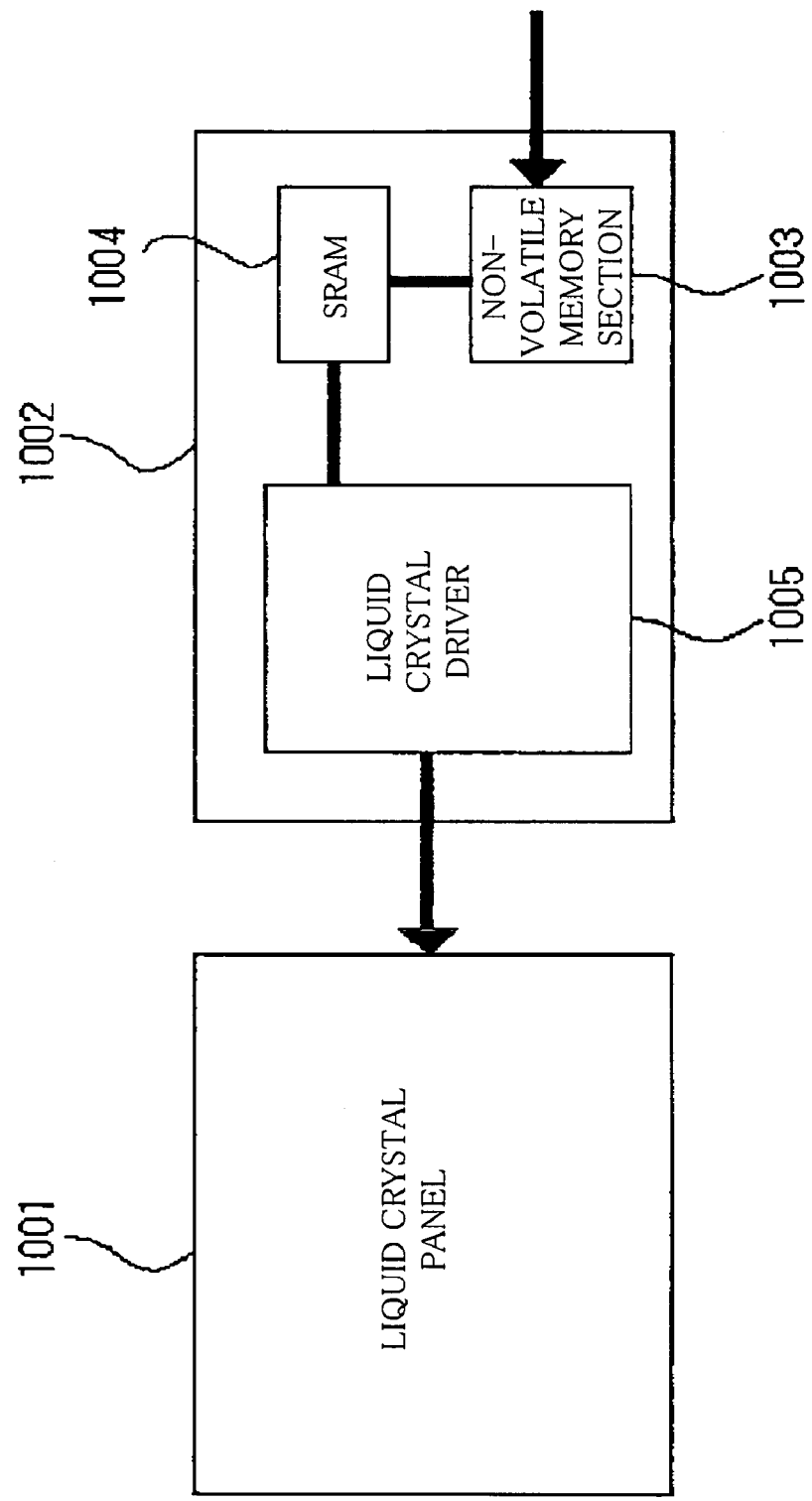
FIG. 28 is a schematic structural drawing of a liquid crystal display (embodiment 11) incorporating the semiconductor memory device in accordance with embodiment 10 of the present invention.

One of application examples of the semiconductor storage device is a non-volatile memory as shown in FIG. 28. The non-volatile memory, which is rewritable, is used for adjusting an image in a liquid crystal panel.

A liquid crystal panel 1001 is driven by a liquid crystal driver 1002. The liquid crystal driver is provided with a non-volatile memory section 1003, an SRAM section 1004, and a liquid crystal driver circuit 1005. The non-volatile memory section 1003 is provided with a memory element of any of Embodiments 1 through 8. It is more preferable that the memory element provided in the non-volatile memory section 1003 is the semiconductor storage device described in Embodiment 10. The non-volatile memory section 1003 can be rewritten by external operation.

Data stored in the non-volatile memory section 1003 is transferred to the SRAM section when the liquid crystal panel 1001 is powered on. The liquid crystal driver circuit 1005 can read out the stored data from the SRAM section when necessary. With the arrangement in which the SRAM section is provided, it is possible to attain a very fast read-out of the stored data.

The liquid crystal driver 1002 may be, as shown in FIG. 28, provided externally of the liquid crystal panel 1001, but may be formed on the liquid panel 1001.

In liquid crystal panels, a gray level to be displayed is changed by applying multi-leveled voltages on each pixel. However, different liquid crystal panels have different relationships between the applied voltage and the gray level to be displayed. Therefore, with an arrangement in which date for compensating unevenness among individual liquid crystal panels is stored in the liquid crystal panels after being produced, it is possible to attain even image quality among the liquid crystal panels by performing compensation based on the data. Therefore, it is preferable that the liquid crystal panel is provided with a rewritable non-volatile memory for storing the data for the compensation. It is preferable to use the memory element of the present embodiment as the non-volatile memory. Especially, it is preferable to use the semiconductor storage device described in Embodiment 10. In the semiconductor storage device described in Embodiment 10, the memory elements of the present embodiment are integrated.

By using the memory element of the present embodiment as the non-volatile memory for adjusting the image in the liquid crystal panel, it is possible to attain low manufacturing cost because it is easy to mount the memory element of the present embodiment, on one chip, together with a circuit such as a liquid crystal driver and the like. Moreover, the semiconductor storage device described in Embodiment 10 is especially suitable for usage in which a relatively small memory capacity is required while high reliability and stability are necessary. In general, the non-volatile memory for adjusting the image in the liquid crystal panel is, for example, several kilo bites and thus has a relatively small memory capacity. Therefore, it is especially preferable to use the semiconductor storage device described in Embodiment 10 as the non-volatile memory for adjusting the image in the liquid crystal panel.

Embodiment 12

Figure 29:
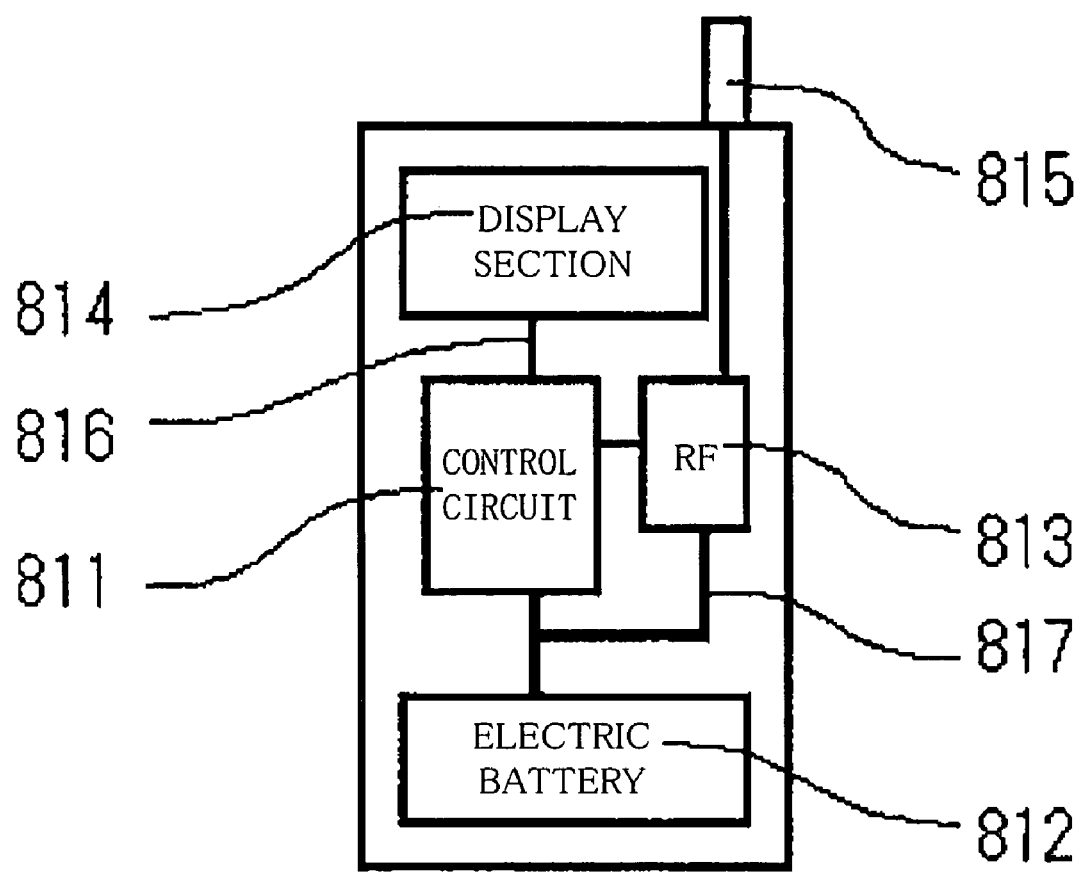
FIG. 29 is a schematic structural drawing of a mobile electronic device (embodiment 12) incorporating the semiconductor memory device in accordance with embodiment 10 of the present invention.
Figure 30:
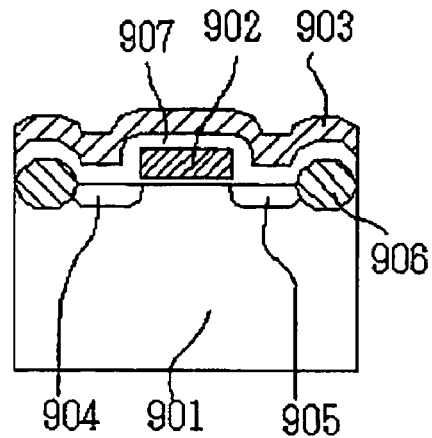
FIG. 30 is a schematic cross-sectional view of a major part of a conventional flash memory.

FIG. 29 shows a portable telephone, which is a portable electronic apparatus in which the semiconductor storage device described in Embodiment 10 is included.

The portable telephone is mainly provided with a control circuit 811, an electric battery 812, an RF (Radio Frequency) circuit 813, a display section 814, an antenna 815, a signal line 816, a power line 817, and the like. The control circuit 811 is provided with the semiconductor storage device described in Embodiment 10. It is preferable that the control circuit 811 is an integrated circuit which has the arrangement as described in Embodiment 10, and which functions as both a memory circuit element and a logic circuit element. With this arrangement, it becomes easier to produce the integrated circuit and reduce a production cost of the portable electronic apparatus, especially.

As described above, it is possible to attain faster operation speed and lower production cost of the portable electronic apparatus by using the semiconductor storage device in the portable electronic apparatus, the semiconductor storage device being advantageous in allowing easy process of mounting together a logic circuit section and a memory section and in attaining a high-speed read-out. Therefore, it is possible to attain a portable electronic apparatus having a low cost, a high reliability and high performance.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising:
   a memory array of memory elements each including:
   a gate electrode provided on a semiconductor layer with an intervening gate insulating film;
   a channel region provided beneath the gate electrode;
   a diffusion area provided on both sides of the channel region, having an opposite polarity to the channel region; and
   a memory functioning member provided on both sides of the gate electrodes, having a function of storing electric charge, the memory functioning member being formed by at least one of an insulating film including at least one conductor or semiconductor dot and an insulating film including a ferroelectric film in which inner charge of the ferroelectric film is polarized by an electric filed and in which the polarized state is held;

a page buffer circuit connected to a main bus via a first port and to an internal bus via a second port, containing multiple page planes;

an access control circuit operating either in a user mode or in a memory control mode as determined by a control signal, enabling access to the page planes over the main bus when in the user mode and over the internal bus when in the memory control mode;

an interface circuit connected to the main bus and the page buffer circuit, generating the control signal to assign the page planes to the user mode and the memory control mode in accordance with a command received over the main bus; and a memory control circuit controlling at least write operation to the memory array, connected to the page buffer circuit over the internal bus and accessing the page buffer circuit in the memory control mode.

2. The semiconductor memory device as set forth in claim 1, wherein the interface circuit assigns a first one of the page planes to the user mode according to a rewrite page buffer continuous command in the command, receives a rewrite data block over the main bus, and transfers the rewrite data block to the first page plane.

3. The semiconductor memory device as set forth in claim 2, wherein the interface circuit, when having received the rewrite page buffer continuous command containing a program including a page buffer command, assigns the first page plane to the memory control mode according to the program.

4. The semiconductor memory device as set forth in claim 3, wherein the interface circuit, if a second one of the page planes is not assigned to the memory control mode, assigns the second page plane to the user mode.

5. The semiconductor memory device as set forth in claim 4, wherein the interface circuit, when having received a next rewrite page buffer continuous command and a next rewrite data block over the main bus, transfers the received next rewrite data block to the second page plane.

6. The semiconductor memory device as set forth in claim 1, wherein:

the page planes include a first page plane and a second page plane; and the interface circuit assigns the second page plane to the user mode according to a rewrite page buffer continuous command in the command, receives a rewrite data block over the main bus, and transfers the rewrite data block to the second page plane.

7. The semiconductor memory device as set forth in claim 6, wherein the interface circuit, when having received the rewrite page buffer continuous command containing a program including a page buffer command, assigns the second page plane to the memory control mode according to the program.

8. The semiconductor memory device as set forth in claim 7, wherein the interface circuit, if the first page plane is not assigned to the memory control mode, assigns the first page plane to the user mode.

9. The semiconductor memory device as set forth in claim 1, wherein:

the page planes include a first page plane and a second page plane; and the interface circuit swaps the user mode and the memory control mode between the first page plane and the second page plane according to a swap page buffer command in the command.

10. The semiconductor memory device as set forth in claim 1, wherein the memory functioning member in the memory element includes an electric charge store film extending substantially parallel to a side of the gate electrode.

11. The semiconductor memory device as set forth in claim 1, wherein the semiconductor layer in the memory element has a greater concentration area close to the diffusion area than close to a surface of the semiconductor layer beneath the gate electrode.

12. The semiconductor memory device as set forth in claim 1, wherein:

the memory element has an insulating film separating the channel region or the semiconductor layer from a film having a surface substantially parallel to a surface of the gate insulating film to store electric charge; and the insulating film is thinner than the gate insulating film and not thicker than 0.8 nm.

13. The semiconductor memory device as set forth in claim 1, wherein each memory functioning member is overlapped with one of the diffusion regions.

14. The semiconductor memory device as set forth in claim 13, wherein an overlap amount of the memory functioning member and the diffusion region is greater than 10 nm.

15. The semiconductor memory device as set forth in claim 1, wherein each diffusion region is disposed so as to be offset from an end of the gate electrode.

16. The semiconductor memory device as set forth in claim 15, wherein a distance between each diffusion region and the end of the gate electrode is less than 100 nm.

17. The semiconductor memory device as set forth in claim 15, wherein the writing or erasing operation to selected one of the memory functioning members provided on both sides of the gate electrode can be executed independently from the other unselected one by controlling each voltage applied to the diffusion region and the gate electrode.

18. A page buffer resource assign method of assigning a page buffer resource in a semiconductor memory device with a memory array of memory elements, the memory elements each including:

a gate electrode provided on a semiconductor layer with an intervening gate insulating film;

a channel region provided beneath the gate electrode;

a diffusion area provided on both sides of the channel region, having an opposite polarity to the channel region; and a memory functioning member provided on both sides of the gate electrode, having a function of storing electric charge, the memory functioning member being formed by at least one of an insulating film including at least one conductor or semiconductor dot and an insulating film including a ferroelectric film in which inner charge of the ferroelectric film is polarized by an electric filed and in which the polarized state is held;

said method comprising the steps of:

receiving a rewrite page buffer continuous command over a main bus and assigning a first page plane to a user mode so as to enable access to the first page plane over the main bus in the user mode, the first page plane being provided in a page buffer resource connected to the main bus via a first port and to an internal bus via a second port;

receiving a rewrite data block over the main bus and transferring the rewrite data block to the first page plane;

receiving a program containing a page buffer command and assigning the first page plane to a memory control mode so as to enable a memory control circuit to access the first page plane in the memory control mode over the internal bus; and when a second page plane in the page buffer resource is not assigned to the memory control mode, assigning the second page plane to the user mode.

19. The page buffer resource assign method as set forth in claim 18, further comprising the step of receiving a next rewrite page buffer continuous command and a next rewrite data block over the main bus and transferring the received next rewrite data block to the second page plane.

20. The page buffer resource assign method as set forth in claim 18, further comprising the step of programming the memory array with the rewrite data block from the first page plane while receiving a next rewrite page buffer continuous command and a next rewrite data block over the main bus and transferring the received next rewrite data block to the second page plane.

21. The page buffer resource assign method as set forth in claim 18, wherein the memory functioning member in the memory element includes an electric charge store film extending substantially parallel to a side of the gate electrode.

22. The page buffer resource assign method as set forth in claim 18, wherein the semiconductor layer in the memory element has a greater concentration area close to the diffusion area than close to a surface of the semiconductor layer beneath the gate electrode.

23. The page buffer resource assign method as set forth in claim 18, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

24. A page buffer resource assign method of assigning a page buffer resource in a semiconductor memory device with a memory array of memory elements, the memory elements each including:
a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrode, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held;
said method comprising the steps of:
the page buffer resource receiving a rewrite page buffer continuous command over a main bus, the page buffer resource including a first page plane and a second page plane and connected to the main bus via a first port and to an internal bus via a second port;
assigning the first page plane to a user mode so as to enable access to the first page plane over the main bus in the user mode;
receiving a rewrite data block over the main bus and transferring the rewrite data block to the first page plane;
receiving a program containing a page buffer command and assigning the first page plane to a memory control mode according to the program so as to enable a memory control circuit to internally access the first page plane in the memory control mode; and
receiving a swap page buffer command over the main bus and swapping the user mode and the memory control mode between the first page plane and the second page plane.

25. The page buffer resource assign method as set forth in claim 24, wherein the memory functioning member in the memory element includes an electric charge store film extending substantially parallel to a side of the gate electrode.

26. The page buffer resource assign method as set forth in claim 24, wherein the semiconductor layer in the memory element has a greater concentration area close to the diffusion area than close to a surface of the semiconductor layer beneath the gate electrode.

27. The page buffer resource assign method as set forth in claim 24, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

28. A page buffer resource assign circuit assigning a page buffer resource in a semiconductor memory device with a memory array of memory elements, the memory elements each including:
a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrodes, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held;
the page buffer circuit being connected to a main bus via a first port and to an internal bus via a second port;
the page buffer resource assign circuit comprising an assign control circuit:
(1) receiving a rewrite page buffer continuous command over the main bus and assigning a first page plane to a user mode so as to enable access to the first page plane in the page buffer resource over the main bus in the user mode;
(2) receiving a rewrite data block over the main bus and transferring the rewrite data block to the first page plane;
(3) receiving a program containing a page buffer command and assigning the first page plane to a memory control mode according to the program so as to enable a memory control circuit to access the first page plane in the memory control mode over the internal bus; and
(4) when a second page plane in the page buffer resource is not assigned to the memory control mode, assigning the second page plane to the user mode.

29. The page buffer resource assign circuit as set forth in claim 28, further comprising a transfer circuit receiving a next rewrite page buffer continuous command over the main bus, receiving a next rewrite data block over the main bus, and transferring the received next rewrite data block to the second page plane.

30. The page buffer resource assign circuit as set forth in claim 28, further comprising a program circuit programming the memory array with the rewrite data block from the first page plane while receiving a next rewrite page buffer continuous command and a next rewrite data block over the main bus and transferring the received next rewrite data block to the second page plane.

31. The page buffer resource assign circuit as set forth in claim 28, wherein the memory functioning member in the memory element includes an electric charge store film extending substantially parallel to a side of the gate electrode.

32. The page buffer resource assign circuit as set forth in claim 28, wherein the semiconductor layer in the memory element has a greater concentration area close to the diffusion area than close to a surface of the semiconductor layer beneath the gate electrode.

33. The page buffer resource assign circuit as set forth in claim 28, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

34. A page buffer resource assign circuit assigning a page buffer resource in a semiconductor memory device with a memory array of memory elements, the memory elements each including:
a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrodes, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held;
the page buffer circuit being connected to a main bus via a first port and to an internal bus via a second port;
the page buffer resource assign circuit comprising an assign control circuit:
(1) receiving a rewrite page buffer continuous command over the main bus and assigning a first page plane to a user mode so as to enable access to the first page plane in the page buffer resource over the main bus in the user mode;
(2) receiving a rewrite data block over the main bus and transferring the rewrite data block to the first page plane;
(3) the assign control circuit receiving a program containing a page buffer command and assigning the first page plane to a memory control mode so as to enable a memory control circuit to access the first page plane in the memory control mode over the internal bus; and
(4) receiving a swap page buffer command over the main bus and swapping the user mode and the memory control mode between the first page plane and a second page plane over the main bus according to the according to swap page buffer command.

35. The page buffer resource assign circuit as set forth in claim 34, wherein the memory functioning member in the memory element includes an electric charge store film extending substantially parallel to a side of the gate electrode.

36. The page buffer resource assign circuit as set forth in claim 34, wherein the semiconductor layer in the memory element has a greater concentration area close to the diffusion area than close to a surface of the semiconductor layer beneath the gate electrode.

37. The page buffer resource assign circuit as set forth in claim 34, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

38. A computer system, comprising:
a central processing unit transferring a command and a rewrite data block over a main bus; and
a semiconductor memory device including a memory array of memory elements and a page buffer resource,
the memory elements each including:
a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrodes, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held,
the page buffer resource being connected to the main bus via a first port and to an internal bus via a second port, wherein:
the semiconductor memory device receives the command over the main bus, assigning the page buffer resource in accordance with the command, and receives and buffers a rewrite data block in the page buffer resource while writing another rewrite data block to the memory array; and
the semiconductor memory device including:
a memory control circuit connected to the internal bus, controlling at least write operation to the memory array; and
an interface circuit connected to the main bus and the page buffer resource, receiving a command over the main bus and generating a control signal to assign page planes in the page buffer resource to a user mode and a memory control mode in accordance with the received command.

39. The computer system as set forth in claim 38, wherein the interface circuit assigns a first one of the page planes to the user mode according to a rewrite page buffer continuous command in the command, receives a rewrite data block over the main bus, and transfers the received rewrite data block to the first page plane.

40. The computer system as set forth in claim 39, wherein the interface circuit, when having received the rewrite page buffer continuous command containing a program including a page buffer command, assigns the first page plane to the memory control mode according to the program.

41. The computer system as set forth in claim 40, wherein the interface circuit, if a second one of the page planes is not assigned to the memory control mode, assigns the second page plane to the user mode, receives a next rewrite page buffer continuous command and a next rewrite data block over the main bus, and transfers the received next rewrite data block to the second page plane.

42. The computer system as set forth in claim 38, wherein:
the page planes include a first page plane and a second page plane; and
the interface circuit assigns the first page plane to the user mode according to a rewrite page buffer continuous command in the command, receives the rewrite data block over the main bus, and transfers the received rewrite data block to the first page plane.

43. The computer system as set forth in claim 42, wherein the interface circuit, when having received the rewrite page buffer continuous command containing a program including a page buffer command, assigns the first page plane to the memory control mode according to the program.

44. The computer system as set forth in claim 43, wherein the interface circuit, if the second page plane is not assigned to the memory control mode, assigns the second page plane to the user mode.

45. The computer system as set forth in claim 38, wherein:
the page planes include a first page plane and a second page plane; and
the interface circuit assigns the second page plane to the user mode according to a rewrite page buffer continuous command in the command, receives the rewrite data block over the main bus, and transfers the received rewrite data block to the second page plane.

46. The computer system as set forth in claim 45, wherein the interface circuit, when having received the rewrite page buffer continuous command containing a program including a page buffer command, assigns the second page plane to the memory control mode according to the program.

47. The computer system as set forth in claim 46, wherein the interface circuit, if the first page plane is not assigned to the memory control mode, assigns the first page plane to the user mode.

48. The computer system as set forth in claim 38, wherein:
the page planes include a first page plane and a second page plane; and
the interface circuit swaps the user mode and the memory control mode between the first page plane and the second page plane according to swap page buffer command in the command.

49. The computer system as set forth in claim 38, wherein the memory functioning member in the memory element includes an electric charge store film extending substantially parallel to a side of the gate electrode.

50. The computer system as set forth in claim 38, wherein the semiconductor layer in the memory element has a greater concentration area close to the diffusion area than close to a surface of the semiconductor layer beneath the gate electrode.

51. The computer system as set forth in claim 38, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

52. A mobile electronic device, comprising the computer system as set forth in claim 38.

53. A computer system, comprising:
a central processing unit transferring a command and a rewrite data block over a main bus; and
a semiconductor memory device including a memory array of memory elements and a page buffer resource,
the memory elements each including:

a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrodes, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held,
the page buffer resource being connected to the main bus via a first port and to an internal bus via a second port, wherein
the semiconductor memory device includes an assign control circuit:
(1), being connected to the main bus and the second port, receiving a command and assigning the page buffer resource to receive and buffer the rewrite data block while writing another rewrite data block to the memory array;
(2) receiving the rewrite data block over the main bus and transferring the rewrite data block to a first page plane in the page buffer resource;
(3) receiving a rewrite page buffer continuous command over the main bus and assigning the first page plane to a user mode so as to enable access to the first page plane over the main bus in the user mode;
(4) receiving a program including a page buffer command and assigning the first page plane to a memory control mode according to the program so as to enable a memory control circuit to access the first page plane over the internal bus in the memory control mode; and
(5) if a second page plane in the page buffer resource is not assigned to the memory control mode, assigning the second page plane to the user mode.

54. The computer system as set forth in claim 53, wherein the assign control circuit receives a next rewrite page buffer continuous command and a next rewrite data block over the main bus, and transfers the next rewrite data block to the second page plane.

55. The computer system as set forth in claim 53, further comprising a program circuit programming the memory array with the rewrite data block from the first page plane while receiving a next rewrite page buffer continuous command and a next rewrite data block over the main bus and transferring the received next rewrite data block to the second page plane.

56. The computer system as set forth in claim 53, wherein the memory functioning member in the memory element includes an electric charge store film extending substantially parallel to a side of the gate electrode.

57. The computer system as set forth in claim 53, wherein the semiconductor layer in the memory element has a greater concentration area close to the diffusion area than close to a surface of the semiconductor layer beneath the gate electrode.

58. The computer system as set forth in claim 53, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

59. A mobile electronic device, comprising the computer system as set forth in claim 53.

60. A computer system, comprising:
a central processing unit transferring a command and a rewrite data block over a main bus; and
a semiconductor memory device including a memory array of memory elements and a page buffer resource,
the memory elements each including:
a gate electrode provided on a semiconductor layer with an intervening gate insulating film;
a channel region provided beneath the gate electrode;
a diffusion area provided on both sides of the channel region, having an opposite polarity to the channel region; and
a memory functioning member provided on both sides of the gate electrodes, having a function of storing electric charge, the memory functioning member being formed by at least one of an insulating film including at least one conductor or semiconductor dot, and an insulating film including a ferroelectric film in which inner charge of the ferroelectric film is polarized by an electric filed and in which the polarized state is held, the page buffer resource being connected to the main bus via a first port and to an internal bus via a second port, having a first page plane and a second page plane, wherein
the semiconductor memory device includes an assign control circuit:
(1), being connected to the main bus and the second port, receiving a command and assigning the page buffer resource to receive and buffer the rewrite data block while writing another rewrite data block to the memory array;
(2) receiving a rewrite page buffer continuous command over the main bus and assigning the first page plane to a user mode so as to enable access to the first page plane in the page buffer resource over the main bus in the user mode;
(3) receiving the rewrite data block over the main bus and transferring the rewrite data block to the first page plane;
(4) receiving a program including page buffer command and assigning the first page plane to a memory control mode according to the program.

61. The computer system as set forth in claim 60, wherein the memory functioning member in the memory element includes an electric charge store film extending substantially parallel to a side of the gate electrode.

62. The computer system as set forth in claim 60, wherein the semiconductor layer in the memory element has a greater concentration area close to the diffusion area than close to a surface of the semiconductor layer beneath the gate electrode.

63. The computer system as set forth in claim 60, wherein:
the memory element has an insulating film separating the channel region or the semiconductor layer from a film having a surface substantially parallel to a surface of the gate insulating film to store electric charge; and
the insulating film is thinner than the gate insulating film and not thicker than 0.8 nm.

64. A mobile electronic device, comprising the computer system as set forth in claim 60.

* * * * *